United States Patent
Su et al.

(10) Patent No.: US 11,296,095 B2
(45) Date of Patent: Apr. 5, 2022

(54) MEMORY DEVICE AND METHOD FOR FORMING THE SAME

(71) Applicant: TAIWAN SEMICONDUCTOR MANUFACTURING CO., LTD., Hsinchu (TW)

(72) Inventors: Hsin-Wen Su, Yunlin County (TW); Yu-Kuan Lin, Taipei (TW); Shih-Hao Lin, Hsinchu (TW); Lien-Jung Hung, Taipei (TW); Ping-Wei Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/900,200

(22) Filed: Jun. 12, 2020

(65) Prior Publication Data
US 2021/0391341 A1   Dec. 16, 2021

(51) Int. Cl.
*H01L 27/112* (2006.01)
*H01L 29/06* (2006.01)
*H01L 29/423* (2006.01)
*H01L 29/49* (2006.01)
*H01L 29/66* (2006.01)
(Continued)

(52) U.S. Cl.
CPC ...... *H01L 27/112* (2013.01); *H01L 21/02532* (2013.01); *H01L 21/02603* (2013.01); *H01L 21/30604* (2013.01); *H01L 27/11206* (2013.01); *H01L 29/0673* (2013.01); *H01L 29/42392* (2013.01); *H01L 29/4908* (2013.01); *H01L 29/66545* (2013.01); *H01L 29/66742* (2013.01); *H01L 29/78696* (2013.01)

(58) Field of Classification Search
CPC ......... H01L 21/02532; H01L 21/02603; H01L 21/30604; H01L 21/823412; H01L 21/823431; H01L 21/8239; H01L 27/112; H01L 27/11206; H01L 27/115; H01L 27/11517; H01L 27/11563; H01L 27/11585; H01L 27/12; H01L 29/0673; H01L 29/401; H01L 29/413; H01L 29/4232; H01L 29/42384; H01L 29/42392; H01L 29/4908; H01L 29/66477; H01L 29/66545; H01L 29/66742; H01L 29/785; H01L 29/78645; H01L 29/78696; H01L 29/788
See application file for complete search history.

(56) References Cited

U.S. PATENT DOCUMENTS 9,093,530 B2   7/2015   Huang et al.
9,171,929 B2   10/2015  Lee et al.
(Continued)

*Primary Examiner* — Cheung Lee
(74) *Attorney, Agent, or Firm* — Birch, Stewart, Kolasch & Birch, LLP

(57) ABSTRACT

A memory device includes a substrate, first semiconductor layers and second semiconductor layers alternately stacked over the substrate, a first gate structure and a second gate structure crossing the first semiconductor layers and the second semiconductor layers, a first via and a second via over the first gate structure and the second gate structure, and a first word line and a second word line over the first via and the second via. Along a lengthwise direction of the first and second gate structures, a width of the first semiconductor layers is narrower than a width of the second semiconductor layers.

20 Claims, 33 Drawing Sheets

(51) Int. Cl.
*H01L 21/02* (2006.01)
*H01L 21/306* (2006.01)
*H01L 29/786* (2006.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2016/0380056 A1* | 12/2016 | Yeo .................... H01L 29/0653 438/283 |
| 2018/0033797 A1* | 2/2018 | Colinge ............ H01L 29/78654 |
| 2019/0341450 A1* | 11/2019 | Lee ....................... H01L 29/775 |

* cited by examiner

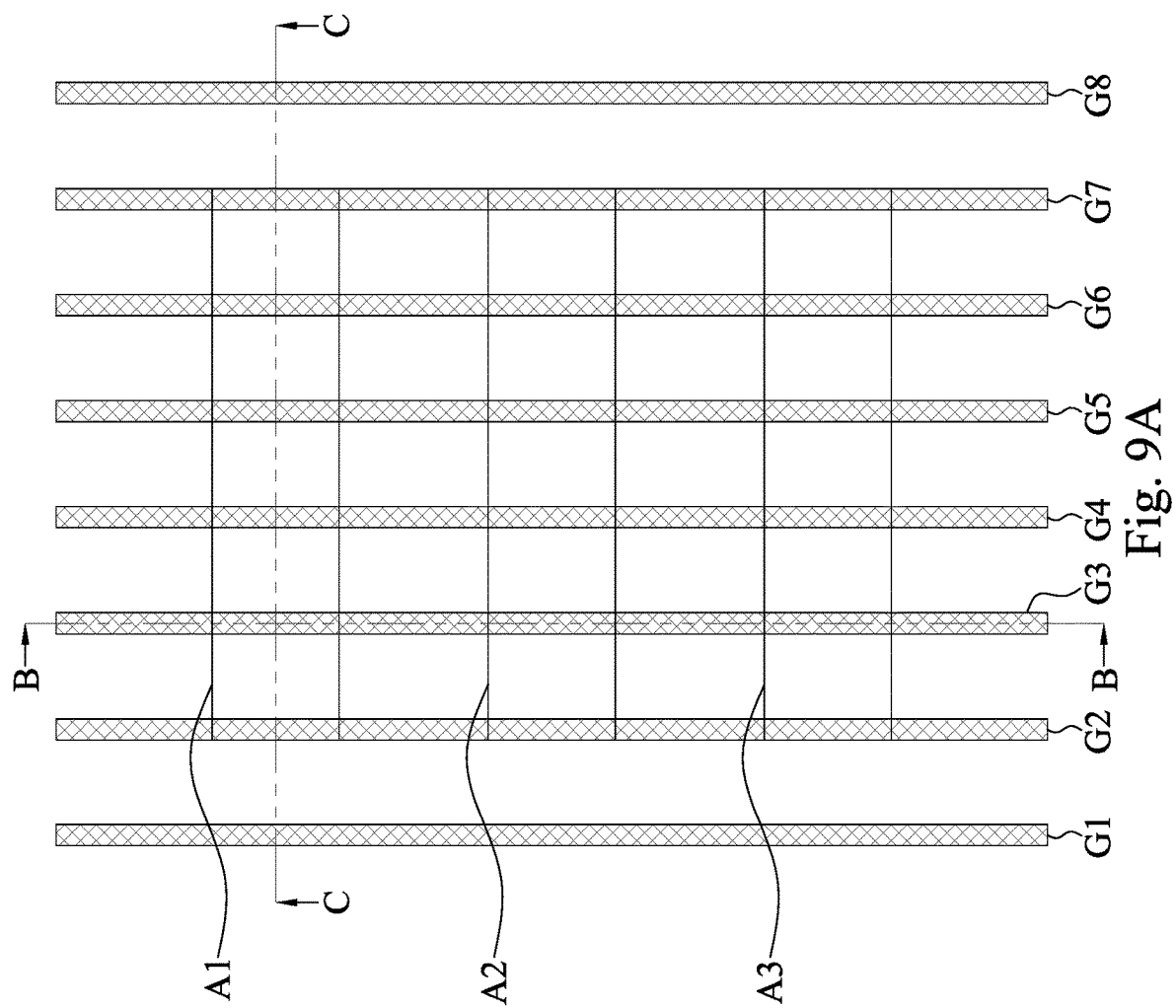

MEMORY DEVICE AND METHOD FOR FORMING THE SAME

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
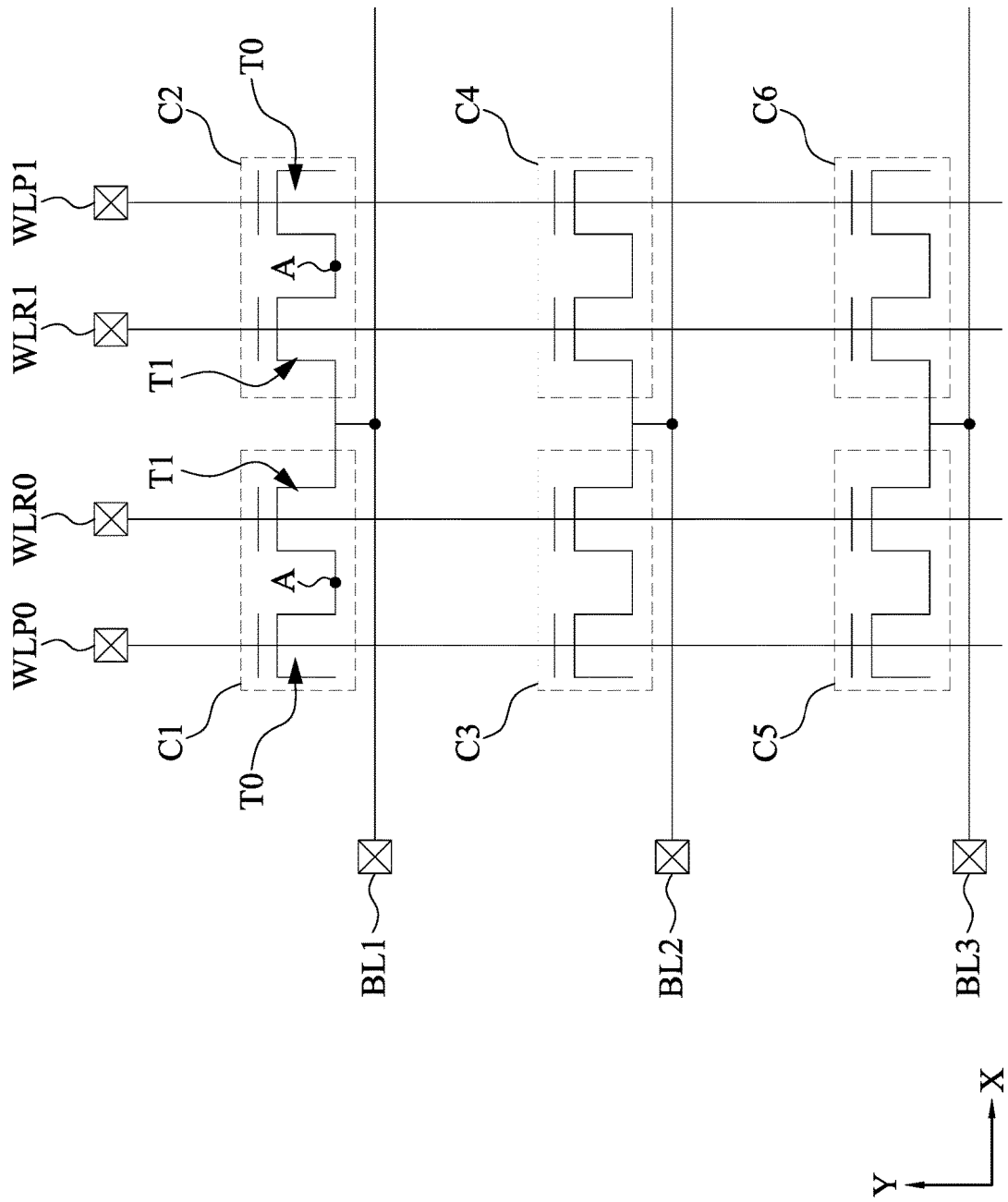
FIG. 1 is a schematic diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present invention includes an embodiment of a one-time programmable (OTP) memory cell. Herein, it may be that the OTP memory cell can be electronically programmed with data only once; and even though power is no longer supplied, programmed data in the OTP memory cell is retained.

FIG. 1 is a schematic circuit of a memory device in accordance with some embodiments. As depicted in FIG. 1, a memory device includes a plurality of OTP memory cells C1, C2, C3, C4, C5, and C6, a plurality of the word lines WLP0, WLR0, WLR1, WLP1, and a plurality of the bit lines BL1, BL2, BL3. The word lines WLP0, WLR0, WLR1, and WLP1 are arranged in X-direction, and each of the word lines WLP0, WLR0, WLR1, and WLP1 extends along Y-direction. The bit lines BL1, BL2, BL3 are arranged in Y-direction, and each of the bit lines BL1, BL2, BL3 extends along X-direction.

In some embodiments, each of the OTP memory cells C1-C6 includes a first transistor T0 and a second transistor T1. With respect to the OTP memory cell C1, a gate terminal of the first transistor T0 is electrically coupled to the word line WLP0, and a gate terminal of the second transistor T1 is electrically coupled to the word line WLR0. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first transistor T0 is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1.

With respect to the OTP memory cell C2, a gate terminal of the first transistor T0 is electrically coupled to the word line WLP1, and a gate terminal of the second transistor T1 is electrically coupled to the word line WLR1. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first MOS transistor is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1. In some embodiments, the OTP memory cells C1 and C2 share the same bit line BL1.

The OTP memory cell C3-C6 are similar to the OTP memory cells C1 and C2 as described above, and thus relevant details will not be repeated for brevity.

Generally, a gate of a transistor is formed by laminating conductive layers on an insulating layer. In a programming operation, an insulating layer of the gate of the first transistor T0 may be destroyed. The second transistor T1 serves as a switching element in order to select the OTP memory cell.

Figure 2A:
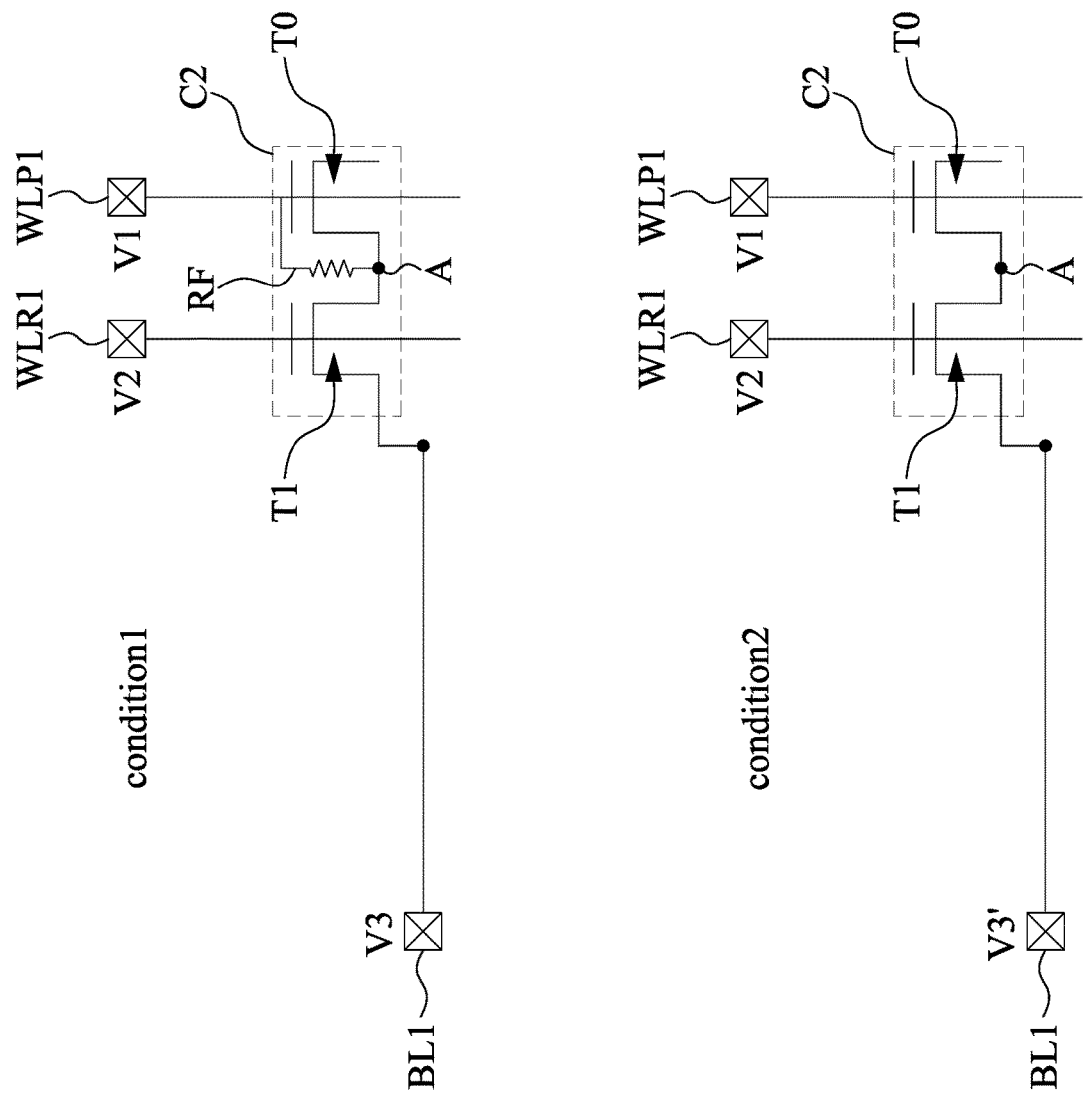
FIG. 2A is a schematic diagram for performing a programming operation to a memory device in accordance with some embodiments.
Figure 2B:
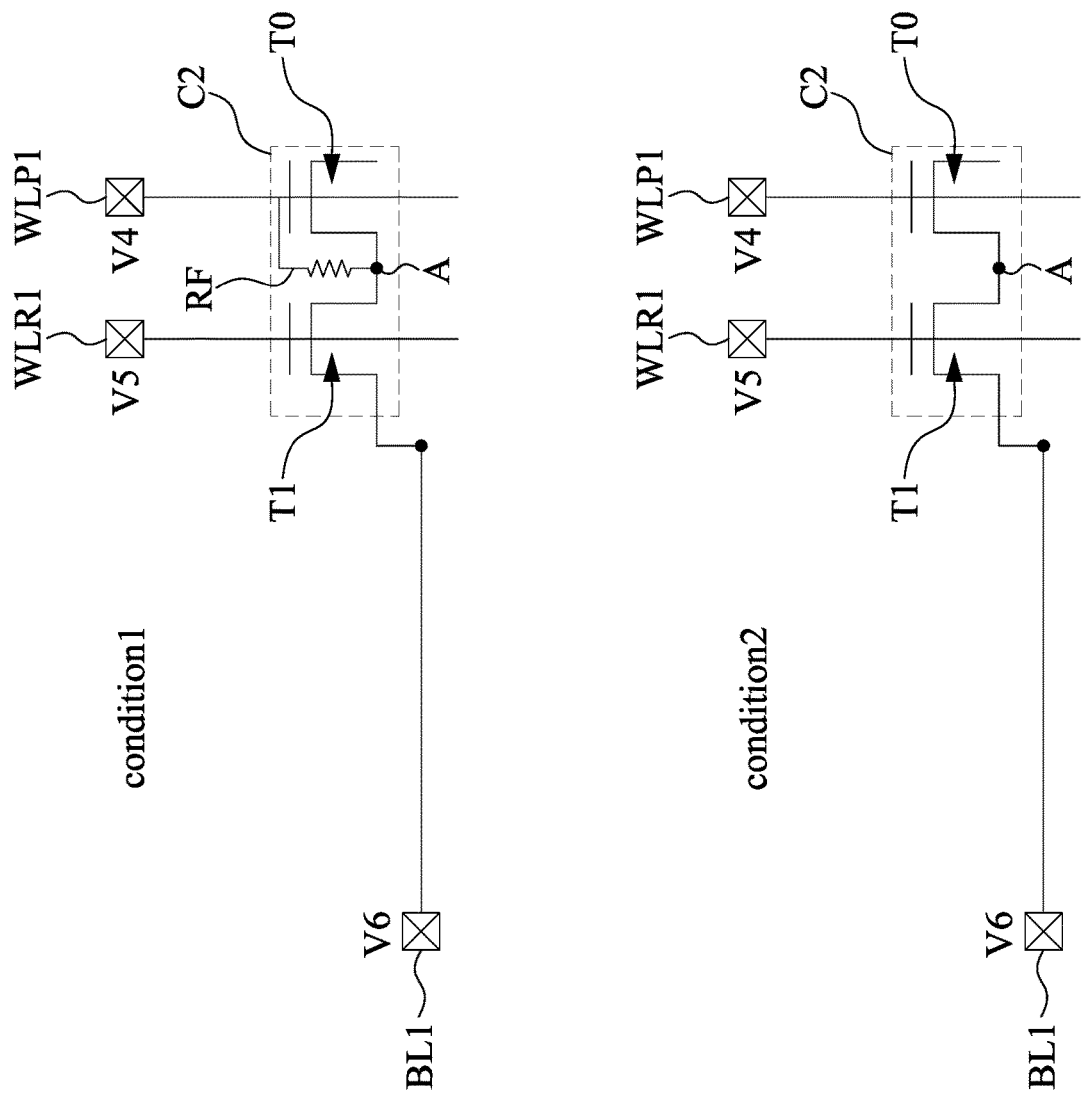
FIG. 2B is a schematic diagram for performing a read operation to a memory device in accordance with some embodiments.

FIG. 2A is a schematic diagram for performing a programming operation to a memory device in accordance with some embodiments. FIG. 2B is a schematic diagram for performing a read operation to a memory device in accordance with some embodiments. It is noted that in FIGS. 2A and 2B, for simplicity, only the OTP memory cell C2 is illustrated. During the programming operation, the bodies of the first and the second MOS transistors M0 and M1 of the OTP memory cell C2 are coupled to a ground voltage.

Reference is made to FIG. 2A, in which FIG. 2A illustrates two different conditions during a programming operation. In condition 1 of FIG. 2A, the word line WLP1 is supplied with a high level voltage V1, and the world line WLR1 is coupled to a voltage V2 having a lower level than the high level voltage V1. The bit line BL1 is coupled to a ground voltage V3. Herein, the voltage V2 is a voltage having a sufficient level to turn on the second transistor T1, and the high level voltage V1 is a voltage having a sufficient level to destroy an insulating layer (e.g., the gate dielectric layer 112 described in FIGS. 3A-3D) included in a gate structure (e.g., the gate structures G3 and/or G6 described in FIGS. 3A-3D) of the first transistor T0. In some embodiments, the voltage V2 may be about 1.2V to about 10V, which is sufficiently high to turn on the second transistor T1, and the high level voltage V1 may be higher than about 1.2V, such as about 5.3V. On the other hand, the ground voltage V3 can be regarded as having a voltage level of about 0V.

Since the gate of second transistor T1 is supplied with a voltage V2 that is sufficiently high to turn on the second transistor T1, the gate of the second transistor T1 is turned on, and thus the resistance node A is coupled to the ground voltage V3. The gate of the first transistor T0 is coupled to the high level voltage V1. Due to a difference of voltage level supplied to the gate (e.g., voltage V1) and voltage level supplied to the one terminal of the first transistor T0 (e.g., voltage V3), the insulating layer of the first transistor T0 is destroyed, i.e., broken down. When the insulating layer is destroyed, a current path is created between the word line WLP1 and the resistance node A. The resulting circuit can be regarded as having a resistance RF in the current path. Accordingly, in condition 1, the OTP memory cell C2 can be referred to as "programmed" after the programming operation, because the insulating layer of the first transistor T0 is destroyed, i.e., broken down.

In this configuration with the first transistor T0 coupled to the ground voltage V3, the insulating layer may not be reliably and/or consistently destroyed. In order to reliably destroy an insulating layer included in the gate structure of first transistor T0 during a programming operation, the insulating layer can be formed thinner than those of other transistors, such as the second transistor T1. Also, to increase programming reliability, the high level voltage V1 can have a higher voltage level than a predetermined voltage level, where the predetermined voltage level can destroy the insulating layer included in the gate structure of first transistor T0.

On the other hand, in condition 2 of FIG. 2A, the word line WLP1 is supplied with the high level voltage V1, and the world line WLR1 is coupled to the voltage V2 having a lower level than the high level voltage V1. The bit line BL1 is coupled to a voltage V3'. Here, the voltage V3' has a higher voltage level than the ground voltage V3 as described in condition 1 of FIG. 2A. For example, the voltage V3' may be about 1.2V, which is higher than the ground voltage V3 (e.g., about 0V). In some embodiments, the voltage V3' has substantially the same value as the voltage V2, such that the voltage difference between the gate terminal of the second transistor T1 and the source region terminal of the second transistor T1 may be about zero so that the second transistor T1 is turned off, and the source/drain terminal of the second transistor T1 connected to the first transistor T0 is floated. Even though the high level voltage V1 is applied to the first transistor T0 through the word line WLP1, an electric field will not be applied to the insulating layer of the second transistor T1 because the source/drain terminal of the first transistor T0 connected to the second transistor T1 is floated. In this way, the insulating layer of the first transistor T0 may not be broken down during the programming operation, the first transistor T0 remains its original function after the programming operation. Accordingly, in condition 2, the OTP memory cell C2 can be referred to as "un-programmed" after the programming operation, because the insulating layer of the first transistor T0 is not destroyed.

Reference is made to FIG. 2B, in which FIG. 2B illustrates two different conditions during a read operation. It is noted that the condition 1 of FIG. 2B follows the condition 1 of FIG. 2A, and the condition 2 of FIG. 2B follows the condition 2 of FIG. 2A.

In a read operation, the word line WLP1 is supplied with a power voltage V4, and the word line WLR1 is coupled to the power voltage V5. The bit line BL1 is precharged with a ground voltage level V6. The power voltage V5 is sufficiently high to turn on the second transistor T1.

In condition 1 of FIG. 2A where the insulating layer included in the gate structure of first transistor T0 is destroyed (breakdown state), the voltage of the bit line BL1 may increase, and a current path between the gate of the first transistor T0 and the bit line BL1 may increase as well. On the other hand, in condition 2 where the insulating layer included in the gate structure of first transistor T0 is not destroyed, the voltage level of bit line BL1 does not rise and therefore retains the precharged voltage level (i.e., ground voltage level V6), and thus there is no current path between the gate of the first transistor T0 and the bit line BL1. Data can be read depending on whether there is current on the bit line BL1. For instance, in condition 1, if the voltage or the current of the bit line BL increases because of the breakdown of the insulating layer of the first transistor T0, data '1' can be determined. On the other hand, if the voltage or the current of the bit line BL does not rise, data '0' can be determined. That is, if the insulating layer breaks down, the bit line BL1 may have a logic level of '1'; if the insulating layer does not break down, the bit line BL1 may have a logic level of '0'.

Figure 3A:
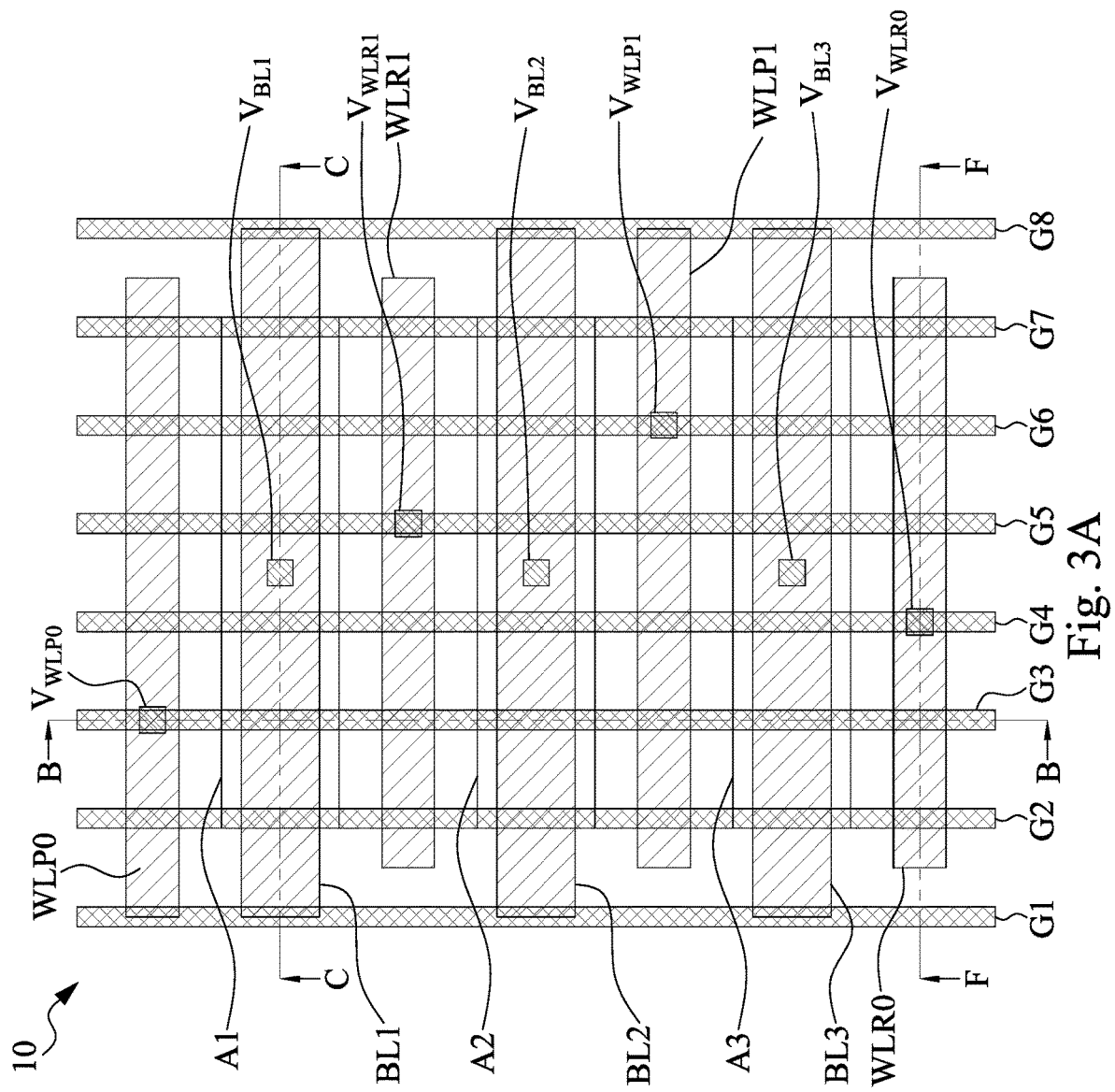
FIG. 3A is a top view of a memory device in accordance with some embodiments.
Figure 3B:
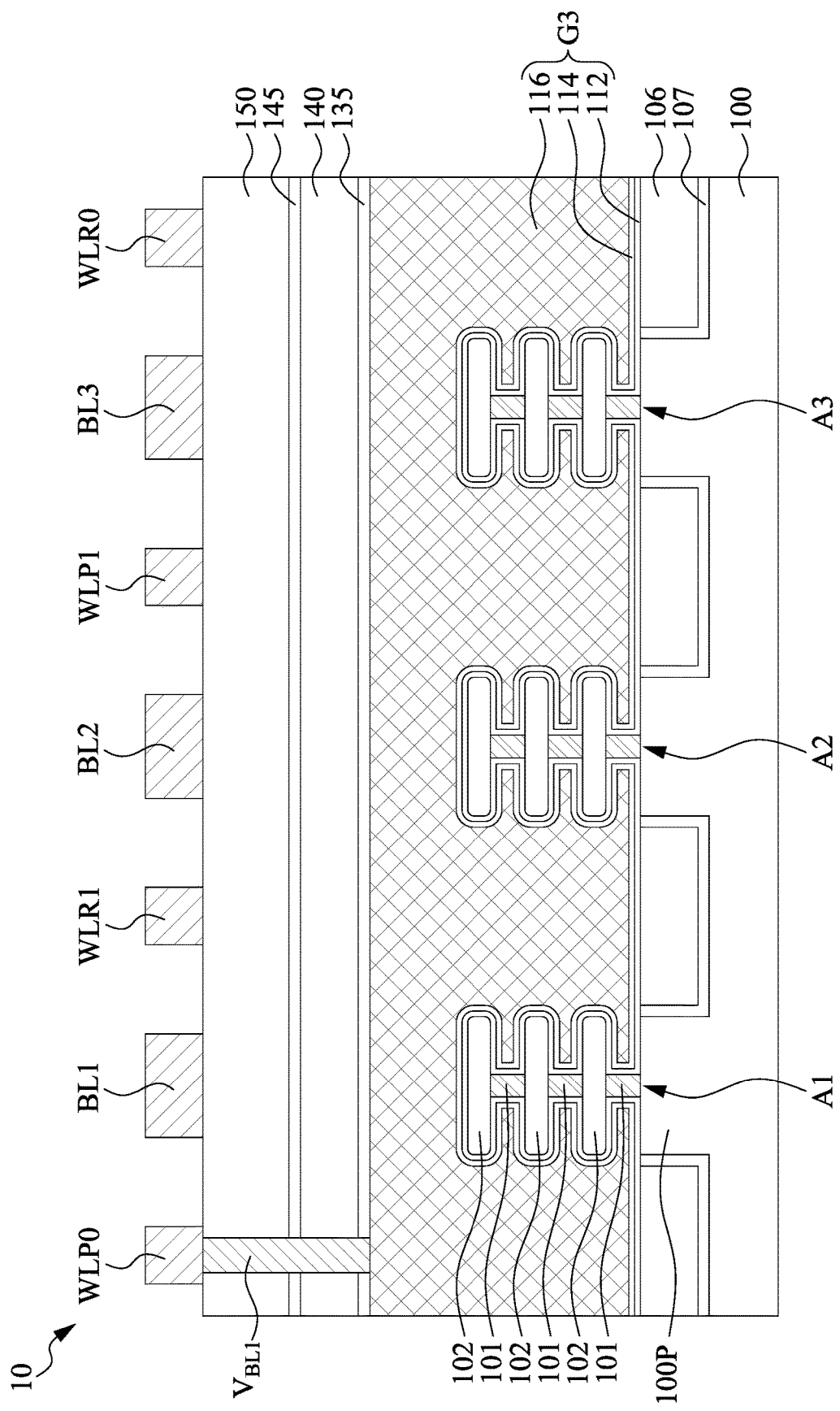
FIGS. 3B and 3C are cross-sectional views of the memory device of FIG. 3A in accordance with some embodiments.
Figure 3C:
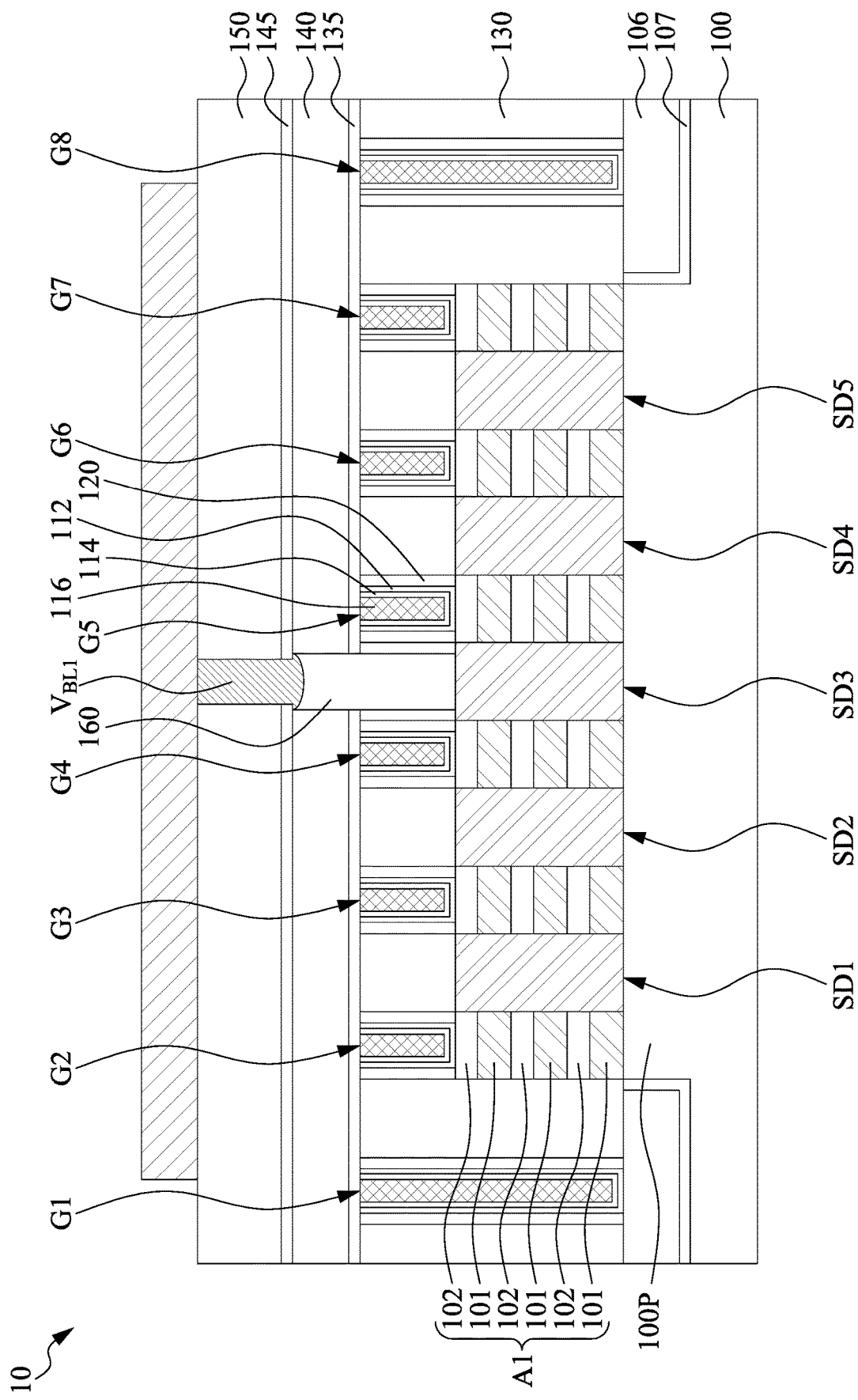
Figure 3D:
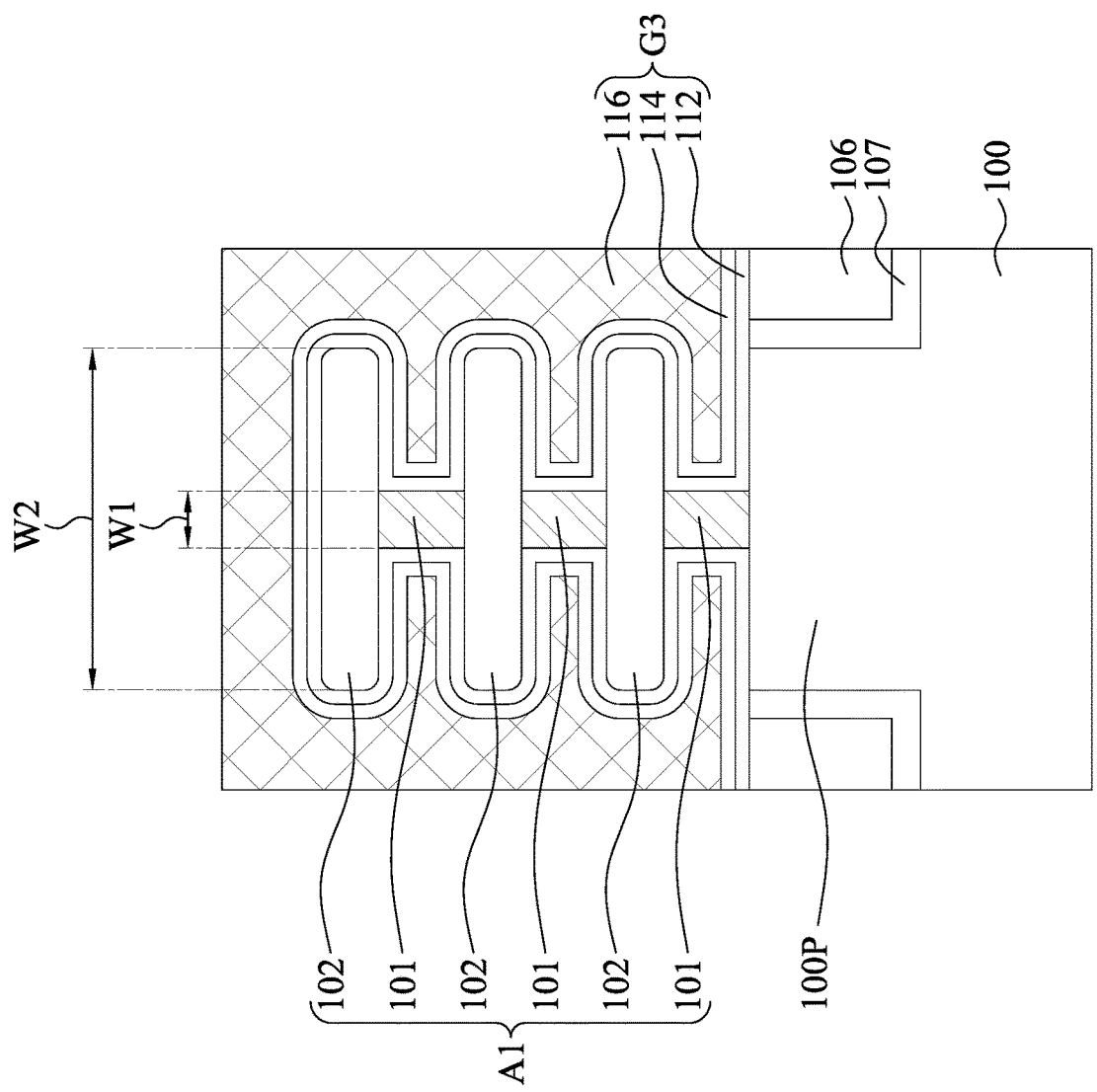
FIG. 3D is an enlarged view of FIG. 3B in accordance with some embodiments.

FIG. 3A is a top view of a memory device 10 in accordance with some embodiments. FIGS. 3B to 3C are cross-sectional views of the memory device of FIG. 3A in accordance with some embodiments, in which FIGS. 3B and 3C are cross-sectional views taken along line B-B and line C-C of FIG. 3A. FIG. 3D is an enlarged view of FIG. 3B. It is noted that some elements of FIGS. 3B and 3C are not illustrated in FIG. 3A for brevity. It is noted that the memory device 10 described in FIGS. 3A to 3C corresponds to the circuit as described in FIG. 1.

The memory device 10 includes a substrate 100 having a plurality of protrusion portions 100P. In some embodiments, the substrate 100 may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

A plurality of channel regions A1, A2, and A3 are disposed over the substrate 100. In some embodiments, each of the channel regions A1, A2, and A3 includes a plurality of first semiconductor layers 101 and second semiconductor layers 102, in which the first semiconductor layers 101 and second semiconductor layers 102 are stacked in an alternate manner, such that a second semiconductor layer 102 is interposed between two first semiconductor layers 101, and a first semiconductor layer 101 is interposed between two second semiconductor layers 102. The first semiconductor layers 101 and the second semiconductor layers 102 have different materials and/or components. In some embodiments, the first semiconductor layers 101 are made of silicon germanium (SiGe), and the second semiconductor layers 102 are made of silicon (Si). In some other embodiments, the first semiconductor layers 101 and the second semiconductor layers 102 are made of SiGe, while the Ge concentration of the second semiconductor layers 102 is lower than the Ge concentration of the first semiconductor layers 101. For example, the first semiconductor layers 101 are $Si_xGe_{1-x}$ and the second semiconductor layers 102 are $Si_yGe_{1-y}$, in which where x<y. In some embodiments, the second semiconductor layers 102 of the channel regions A1, A2, and A3 are in contact with respective protrusion portions 100P of the substrate 100.

The channel regions A1, A2, and A3 and are laterally surrounded by an isolation structure 106 formed of dielectric material. The isolation structure 106 may be a shallow trench isolation (STI) structure, a deep trench isolation (DTI) structure, another suitable isolation structure(s), a combination of the foregoing, or the like. In some embodiments where the STI structure 106 is made of oxide (e.g., silicon oxide), the channel regions A1, A2, A3 can be interchangeably referred to as oxide defined (OD) regions. In some embodiments, a liner 107 is disposed between the channel regions A1, A2, and A3 and the STI structure 106. In some embodiments, the liner 107 is made from SiN or other suitable materials. The isolation structure 106 and the liner 107 are made of different materials. In greater detail, the liner 107 conformally lines and in contact with the protrusion portions 100P of the substrate 100.

A plurality of gate structures G1, G2, G3, G4, G5, G6, G7, and G8 are disposed over the substrate 100. In some embodiments, the gate structures G2 to G7 cross the channel regions A1, A2, A3 along a direction perpendicular to a lengthwise direction of the channel regions A1, A2, A3. That is, the channel regions A1, A2, A3 share the same gate structures G2 to G7. In some embodiments, each of the gate structures G1-G8 includes a gate dielectric layer 112, a work function metal layer 114, and a filling metal 116.

In some embodiments, the gate dielectric layers 112 of gate structures G1-G8 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers 112 are oxide layers. The gate dielectric layers 112 may be formed by a deposition processes, such as chemical vapor deposition (CVD), physical vapor deposition (PVD), atomic layer deposition (ALD), plasma enhanced CVD (PECVD) or other suitable techniques. In some embodiments, the gate dielectric layers 112 of the gate structures G3 and G6 are thinner than the gate dielectric layers 112 of the gate structures G4 and G5, as the gate dielectric layers 112 of the gate structures G3 and G6 may act as the insulting layer of the first transistors T0 described in FIGS. 1 to 2B.

In some embodiments, the work function metal layers 114 of the gate structures G1-G8 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function metal layers 114 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the filling metals 116 of gate structures G1-G8 may include tungsten (W). In some other embodiments, the filling metals 116 include aluminum (Al), copper (Cu) or other suitable conductive material. The filling metals 116 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

A plurality of gate spacers 120 are disposed on opposite sidewalls of the gate structures G1-G8. In some embodiments, the gate spacers 120 may include $SiO_2$, $Si_3N_4$, $SiO_xN_y$, SiC, SiCN films, SiOC, SiOCN films, and/or combinations thereof.

A plurality of source/drain structures SD1, SD2, SD3, SD4, and SD5 are disposed in the channel regions A1, A2, and A3 over the substrate 100. As an example of FIG. 3C, the source/drain structures SD1 and SD2 are disposed on opposite sides of the gate structure G3, the source/drain structures SD2 and SD3 are disposed on opposite sides of the gate structure G4, the source/drain structures SD3 and SD4 are disposed on opposite sides of the gate structure G5, and the source/drain structures SD4 and SD5 are disposed on opposite sides of the gate structure G6, respectively. In some embodiments, the source/drain structures SD1-SD5 may be may be formed by performing an epitaxial growth process that provides an epitaxy material over the substrate 100, and thus the source/drain structures SD1-SD5 can also be interchangeably referred to as epitaxy structures SD1-SD5 in this content. In various embodiments, the source/drain structures SD1-SD5 may include Ge, Si, GaAs, AlGaAs, SiGe, GaAsP, SiP, or other suitable material.

The gate structure G3, the source/drain structures SD1 and SD2, and the channel region A1 form the first transistor T0 of the OTP memory cell C1, and the gate structure G4, the source/drain structures SD2 and SD3, and the channel region A1 form the second transistor T1 of the OTP memory cell C1. Similarly, the gate structure G6, the source/drain structures SD4 and SD5, and the channel region A1 form the first transistor T0 of the OTP memory cell C2, and the gate structure G5, the source/drain structures SD3 and SD4, and the channel region A1 form the second transistor T1 of the OTP memory cell C2. The OTP memory cells C3-C6 of FIG. 1 have similar structures as those of the OTP memory cells C1 and C2 herein, and thus relevant details are omitted for brevity.

As mentioned above with respect to FIG. 1, in some embodiments, the insulating layer (e.g., the dielectric layer 112) of gate structure of first transistor T0 can be formed thinner than those of other transistors, such as the second transistor T1. Accordingly, in some embodiments, the dielectric layers 112 of the gate structures G3 and G6 may be thinner than the dielectric layers 112 of the gate structures G4 and G5.

Reference is made to FIG. 3D, in which FIG. 3D illustrates an enlarged view of the channel regions A1 and the gate structure G3 crossing the channel regions A1. It is understood that the channel regions A2, A3 and the respective gate structures G2, G4, G5, G6 crossing the channel regions A2, A3 have similar structural details, and are omitted for brevity.

In FIG. 3D, the first semiconductor layers 101 have a width W1, and the second semiconductor layers 102 have a width W2, in which width W1 is lower than width W2. That is, in a cross-section along the lengthwise direction of the gate structure G3, the first semiconductor layers 101 are narrower than the second semiconductor layers 102. As a result, portions of the gate structure G3 extend to regions that between two adjacent second semiconductor layers 102. In some embodiments, the gate structures G3 is in contact with top surfaces, sidewalls, and bottom surfaces of the second semiconductor layers 102, and in contact with sidewalls of the first semiconductor layers 101. In some embodiments, top surface and bottom surfaces of the first semiconductor layers 101 are in contact with the second semiconductor layers 102 and the protrusion portion 100P of the substrate 100. In some embodiments, the gate dielectric layer 112, the work function metal layer 114, and the filling metal 116 of the gate structure G3 are directly between the second semiconductor layers 102 and/or directly between the bottommost second semiconductor layer 102 and the protrusion portion 100P of the substrate 100. According to some embodiments, the combination of the first semiconductor layers 101 and the second semiconductor layers 102 can be referred to as a "fin structure." On the other hand, because the second semiconductor layers 102 are suspended over the first semiconductor layers 101 and form a sheet-like structure, the second semiconductor layers 102 can also be referred to as "nanosheets" in this content.

In some embodiments of the present disclosure, because the channel region A1 includes "nanosheet" second semiconductor layers 102, the contact area between the gate structure G3 and the channel region A1 is increased, which in turn will improve the electron mobility, and thus will increase the saturation current $I_{sat}$ of the transistors of the memory device 10 (such as the transistors T0 and T1 discussed in FIG. 1). On the other hand, because the gate dielectric layer 112 of the gate structure G3 contacts corners of the first semiconductor layers 101 and corners of the second semiconductor layers 102, the gate dielectric layer 112 may cause high electric fields at these corners due to "point discharge effect." The electric fields may contribute to the voltage for destroying the dielectric layers of the transistors of memory device 10 (such as the transistors T0 discussed in FIG. 1). Accordingly, the breakdown voltage of the transistors of memory device 10 can be reduced, and thus the power of the memory device may also be reduced.

As mentioned above, the first semiconductor layers 101 have a width W1, and the second semiconductor layers 102 have a width W2, in which width W1 is lower than width W2. In some embodiments, the width W1 is in a range from about 2 nm to about 15 nm, and the width W2 is in a range from about 6 nm to about 20 nm. In some embodiments, the ratio of width W1 to width W2 is in a range from about 1:45 to about 1:9. If the ratio is too large (such as much larger than 1:45), this indicates the width W1 of the first semiconductor layers 101 is too large in some instances, which will reduce contact area between the gate structure G3 and the second semiconductor layers 102, and will result in an unsatisfied device performance. If the ratio is too small (such as much lower than 1:45), the gate dielectric layers 112 would not provide enough electric field to lower the breakdown voltage.

Referring back to FIGS. 3A to 3C, an interlayer dielectric (ILD) layer 130 is disposed over the substrate 100, over the source/drain structures SD1-SD5, and surrounding the gate structures G1-G8. In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 130 may be formed using, for example, CVD, ALD, spin-on-glass (SOG) or other suitable techniques.

An etch stop layer (ESL) 135, an ILD layer 140, a etch stop layer (ESL) 145, and an ILD layer 150 are disposed in sequence over the gate structures G1-G8 and the ILD layer 130. The materials and the formation method of the ILD layers 140 and 150 are similar to those of the ILD layer 130 described above. The ESLs 135 and 145 may include materials different from the ILD layers 130, 140, and 150. In some embodiments, the ESLs 135 and 145 include silicon nitride, silicon oxynitride or other suitable materials. The ESLs 135 and 145 can be formed using, for example, plasma enhanced CVD, low pressure CVD, ALD or other suitable techniques.

Reference is made to FIGS. 3A and 3B. A via $V_{WLP1}$ extends through the ILD layer 150, the ESL 145, and the ILD layer 140, and contacts the metal gate structure G3. The material and the formation method of via $V_{WLP1}$ are similar to those of the via $V_{BL1}$. A word line WLP1 overlies the ILD layer 150 and contacts the $V_{WLP1}$. The material and the formation method of word line WLP1 are similar to those of the bit line BL1.

Referring to FIGS. 3A and 3C, a source/drain contact 160 extends through the ILD layer 140, the ESL 135, and the ILD layer 130 and contacts the source/drain structure SD3. In some embodiments, the source/drain contact 160 may include a liner and a filling metal. The liner is between filling metal and the underlying source/drain structure SD3. In some embodiments, the liner assists with the deposition of filling metal and helps to reduce diffusion of a material of filling metal through the gate spacers 120. In some embodiments, the liner includes titanium (Ti), titanium nitride (TiN), tantalum (Ta), tantalum nitride (TaN), or another suitable material. The filling metal includes a conductive material, such tungsten (W), copper (Cu), aluminum (Al), ruthenium (Ru), cobalt (Co), molybdenum (Mo), nickel (Ni), or other suitable conductive material. In some embodiments, a silicide layer may be disposed between the source/drain contact 160 and the source/drain structure SD3.

A via $V_{BL1}$ extends through the ILD layer 150 and the ESL 145, and contacts the source/drain contact 160. In some embodiments, the via $V_{BL1}$ includes a conductive material, such tungsten (W). Other conductive materials may be used for the via $V_{BL1}$, such as copper (Cu), aluminum (Al), ruthenium (Ru), cobalt (Co), molybdenum (Mo), nickel (Ni), or the like. The via $V_{BL1}$ can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

A bit line BL1 overlies the ILD layer 150 and contacts the via $V_{BL2}$. In some embodiments, the bit line BL1 may include copper (Cu), aluminum (Al), ruthenium (Ru), cobalt (Co), molybdenum (Mo), nickel (Ni), tungsten (W), or the like. The bit line BL1 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

FIGS. 4A to 12B illustrate a method in various stages of fabricating the memory device 10 as described in FIGS. 3A to 3D in accordance with some embodiments of the present disclosure.

Figure 4A:
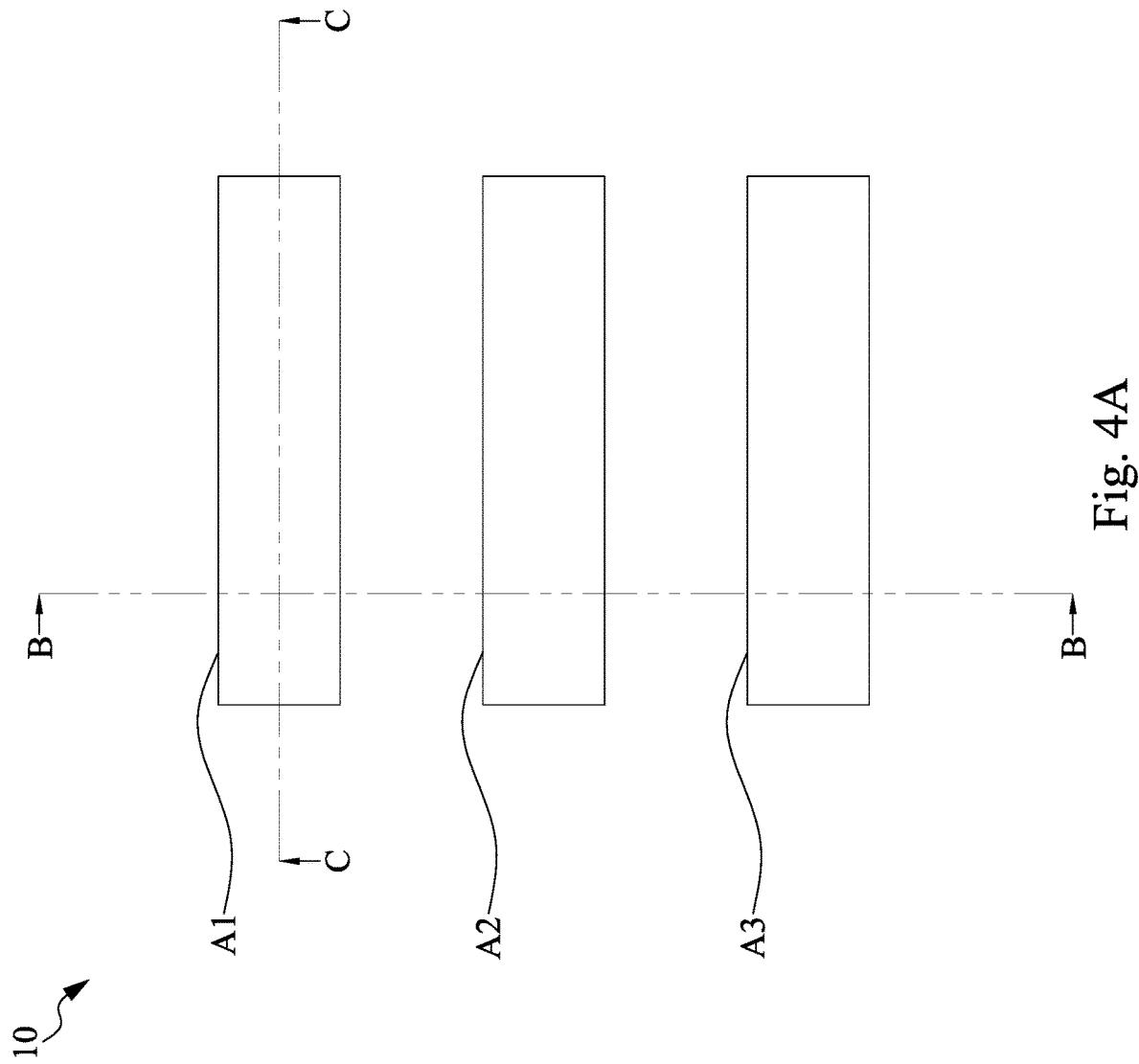
FIGS. 4A to 11C illustrate a method in various stages of fabricating the memory device in accordance with some embodiments of the present disclosure.
Figure 4B:
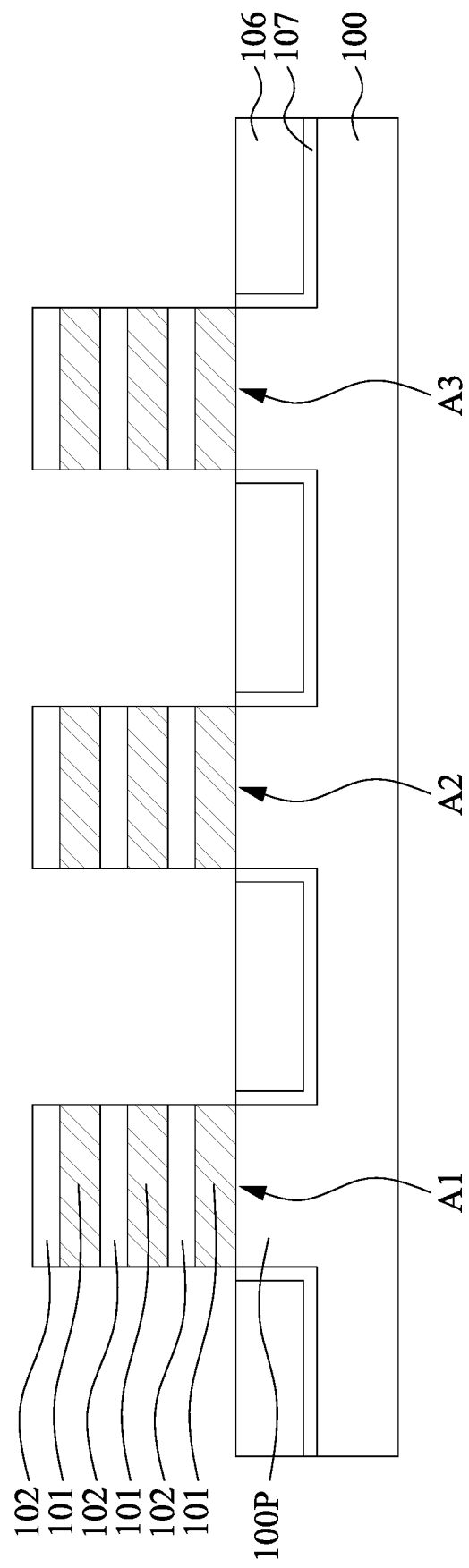
Figure 4C:
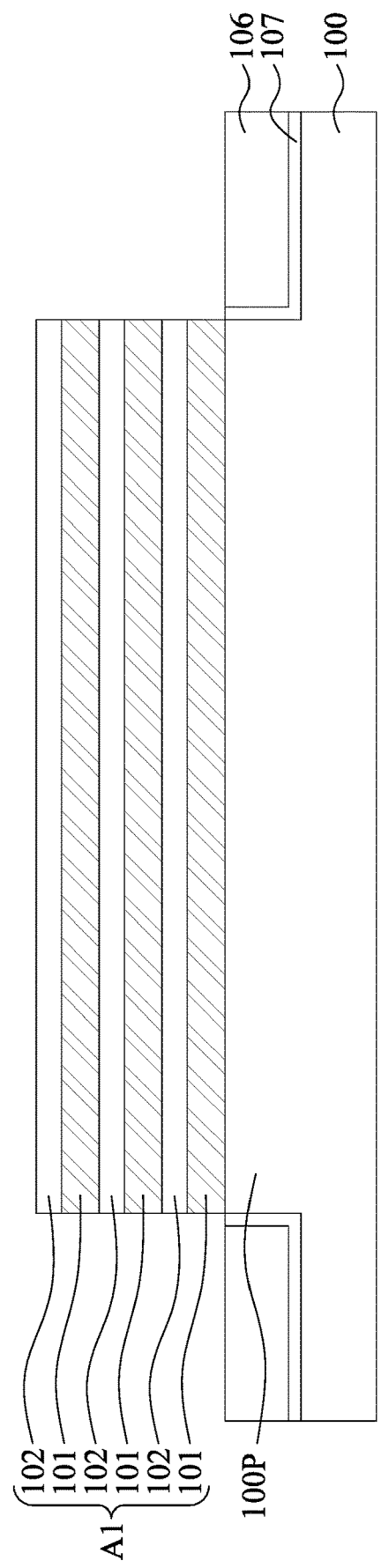

Reference is made to FIGS. 4A to 4C, in which FIG. 4A is a top view of the memory device 10, FIG. 4B is a cross-sectional view along line B-B of FIG. 4A, and FIG. 4C is a cross-sectional view along line C-C of FIG. 4A. Shown there is an initial structure, the initial structure includes a substrate 100, a plurality of channel regions A1, A2, and A3 over the substrate 100, and a liner 107 and an isolation structure 106 laterally surrounding the channel regions A1, A2, and A3.

In some embodiments, the channel regions A1, A2, and A3 may be formed by, for example, alternately depositing first semiconductor layers 101 and the second semiconductor layers 102 over the substrate 100, forming a patterned mask (not shown) that defines positions of the channel regions A1, A2, and A3 over the topmost second semiconductor layer 102, followed by an etching process to remove portions of the first semiconductor layers 101, the second semiconductor layers 102, and the substrate 100. The remaining portions of the first semiconductor layers 101 and the second semiconductor layers 102 form the channel regions A1, A2, and A3. In some embodiments, the substrate 100 is also etched and thus protrusion portions 100P are formed over the substrate 100. In some embodiments, the channel regions A1, A2, and A3 and the respective protrusion portions 100P form a fin-like structure, and thus the channel regions A1, A2, and A3 and the respective protrusion portions 100P can be referred to as "fin structures."

The first semiconductor layers 101 and the second semiconductor layers 102 have different materials and/or components, such that the first semiconductor layers 101 and the second semiconductor layers 102 have different etching rates. In some embodiments, the first semiconductor layers 101 are made from SiGe. The germanium percentage (atomic percentage concentration) of the first semiconductor layers 101 is in the range between about 10 percent and about 20 percent, while higher or lower germanium percentages may be used. It is appreciated, however, that the values recited throughout the description are examples, and may be changed to different values. For example, the first semiconductor layers 101 may be $Si_{0.8}Ge_{0.2}$ or $Si_{0.9}Ge_{0.1}$, the proportion between Si and Ge may vary from embodiments, and the disclosure is not limited thereto. The second semiconductor layers 102 may be pure silicon layers that are free from germanium. The second semiconductor layers 102 may also be substantially pure silicon layers, for example, with a germanium percentage lower than about 1 percent. In some embodiments, the first semiconductor layers 101 have a higher germanium atomic percentage concentration than the second semiconductor layers 102. In some other embodiments, the second semiconductor layers 102 and the substrate 100 may be made from the same material or different materials. The first semiconductor layers 101 and the second semiconductor layers 102 may be formed by chemical vapor deposition (CVD), molecular beam epitaxy (MBE), or other suitable process(es). In some embodiments, the first semiconductor layers 101 and the second semiconductor layers 102 are formed by an epitaxy growth process, and thus the first semiconductor layers 101 and the second semiconductor layers 102 can also be referred to as epitaxial layers in this content.

The liner 107 and the isolation structure 106 may be formed by, for example, depositing a liner material and an isolation material over the substrate 100 and the channel regions A1, A2, and A3, performing a CMP process to remove excessive liner material and isolation material until top surface of the second semiconductor layer is exposed, followed by an etching back process to lower top surfaces of the liner material and isolation material. The remaining portions of the liner material and isolation material are referred to as liner 107 and isolation structure 106, respectively.

Figure 5A:
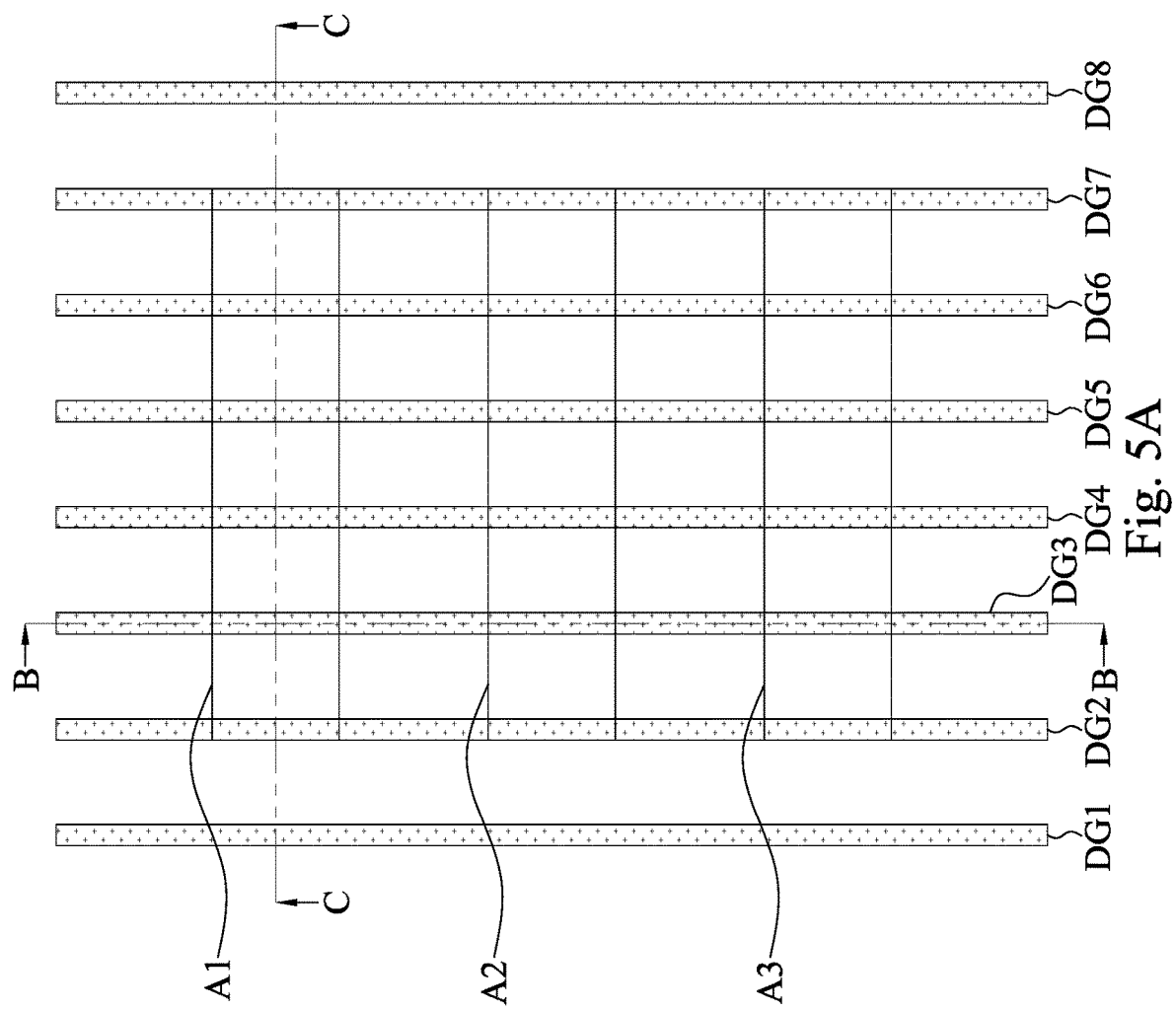
Figure 5B:
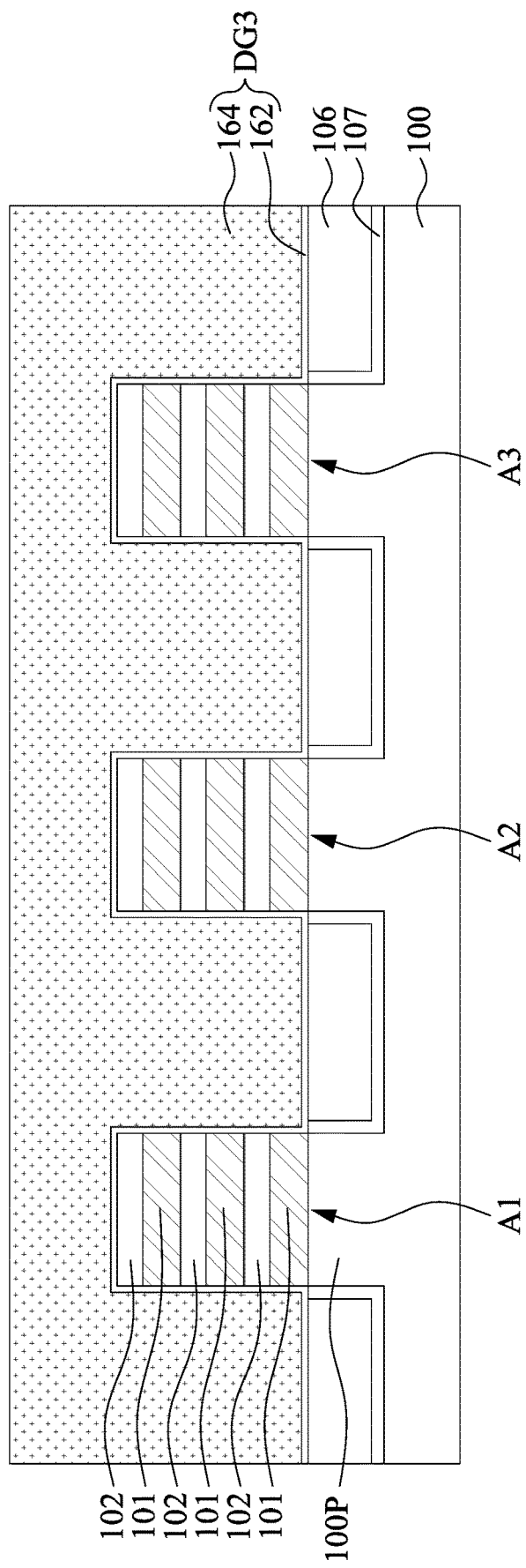
Figure 5C:
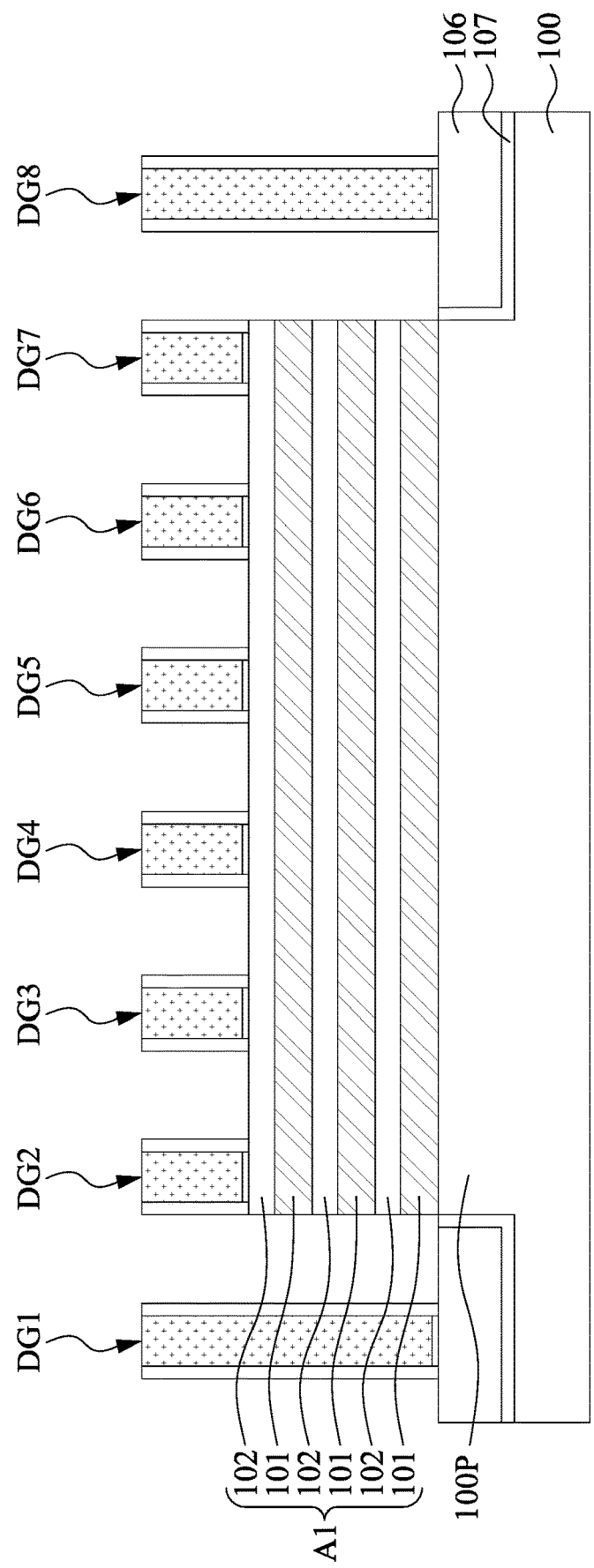

Reference is made to FIGS. 5A to 5C, in which FIG. 5A is a top view of the memory device 10, FIG. 5B is a cross-sectional view along line B-B of FIG. 5A, and FIG. 5C is a cross-sectional view along line C-C of FIG. 4A. A plurality of dummy gate structures DG1, DG2, DG3, DG4, DG5, DG6, DG7, and DG8 are formed over the substrate 100. In some embodiments, the dummy gate structures DG2-DG7 cross the channel regions A1-A3, while the dummy gate structures D1 and D8 do not cross the channel regions A1-A3. Each of the dummy gate structures DG1-DG8 includes a gate dielectric layer 162 and a dummy gate 164. In some embodiments, the dummy gate structures DG1-DG8 may be formed by, for example, depositing a gate dielectric material and a dummy gate material over the substrate 100, followed by a patterning process to pattern the gate dielectric material and the dummy gate material to form the dummy gate structures DG1-DG8.

The gate dielectric layer 162 may be, for example, silicon oxide, silicon nitride, a combination thereof, or the like, and may be deposited or thermally grown according to acceptable techniques. The gate dielectric layer 162 may be formed by suitable process, such as chemical vapor deposition (CVD), physical vapor deposition (PVD), atomic layer deposition (ALD), or any suitable process. The dummy gate layer 164 may include polycrystalline-silicon (poly-Si) or poly-crystalline silicon-germanium (poly-SiGe). Further, the dummy gate layer 164 may be doped poly-silicon with uniform or non-uniform doping. The dummy gate layer 164 may be formed by suitable process, such as chemical vapor deposition (CVD), physical vapor deposition (PVD), atomic layer deposition (ALD), or any suitable process.

A plurality of gate spacers 120 are formed on opposite sidewalls of the dummy gate structures DG1-DG8. The gate spacers 120 may be formed by, for example, depositing a spacer layer blanket over the dummy gate structures DG1-DG8, followed by an etching process to remove horizontal portions of the spacer layer, such that vertical portions of the spacer layer remain on sidewalls of the dummy gate structures DG1-DG8.

Figure 6A:
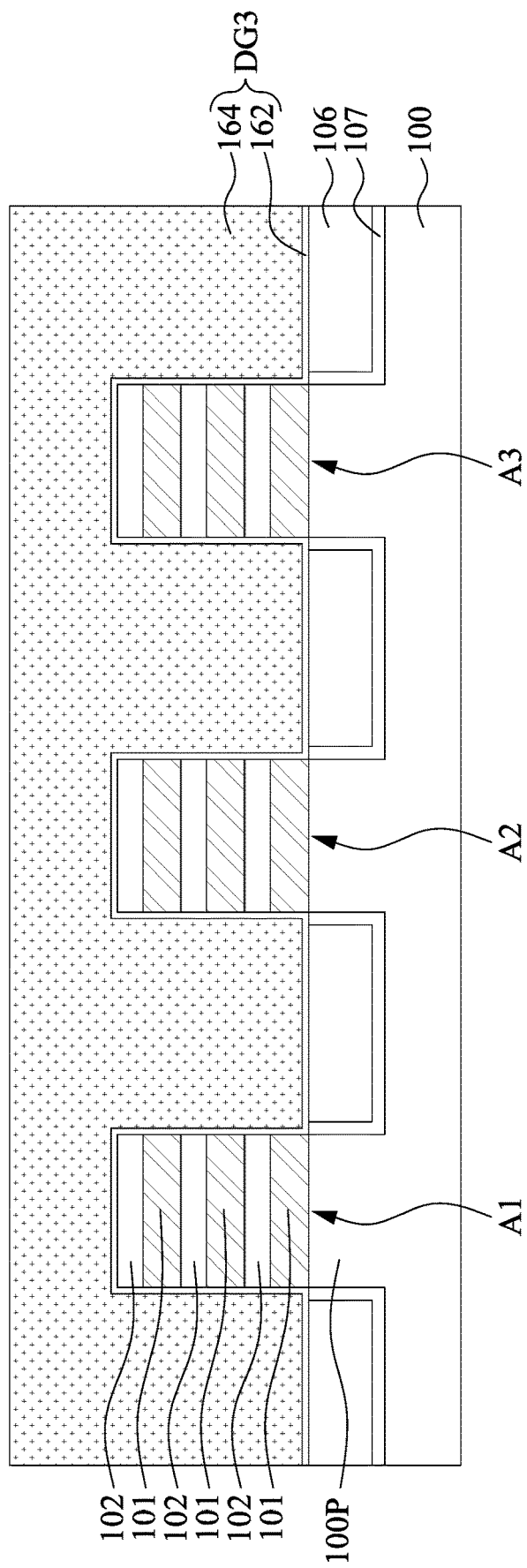
Figure 6B:
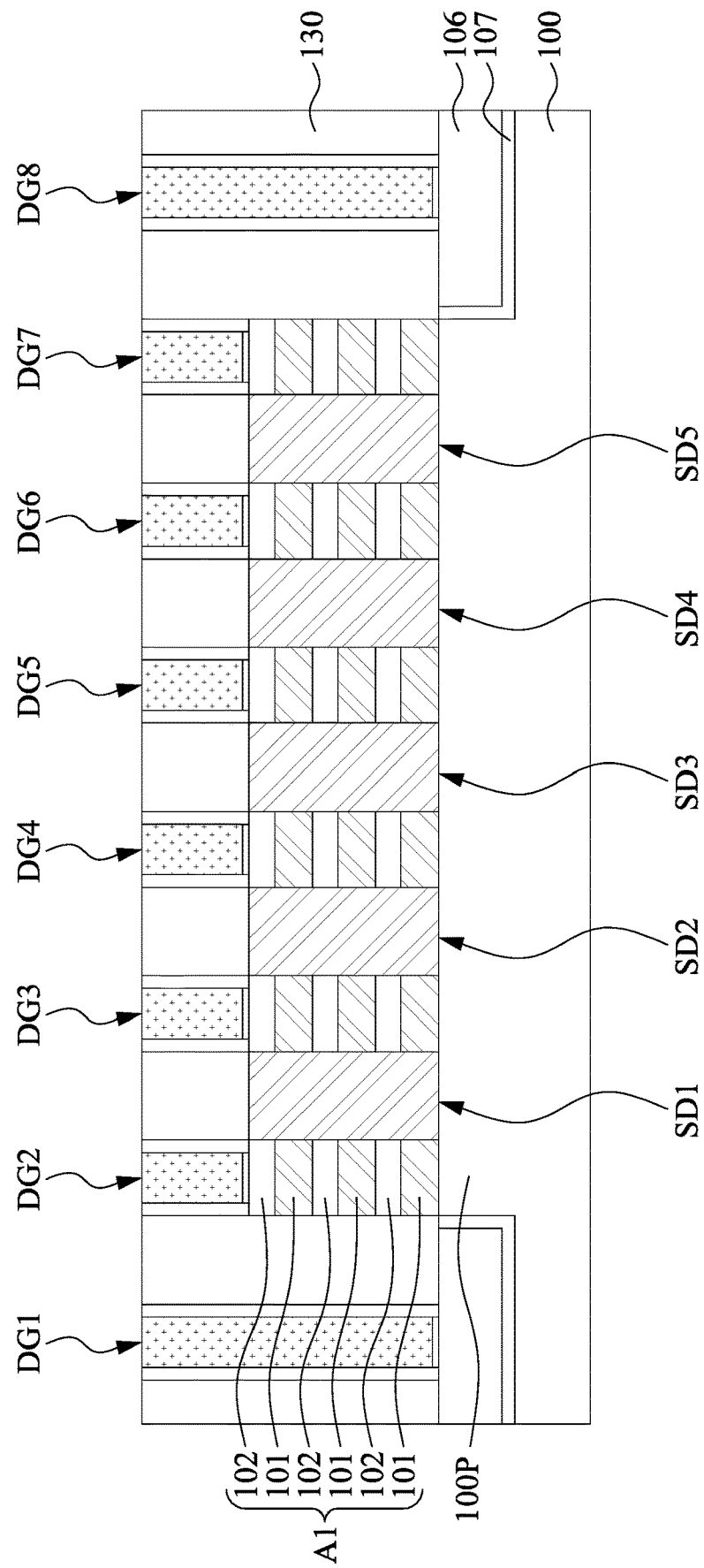

Reference is made to FIGS. 6A and 6B, in which FIGS. 6A and 6B follow FIGS. 5B and 5C, respectively. A plurality of source/drain structures SD1, SD2, SD3, SD4, and SD5 are formed in the channel regions A1-A3. As an example in FIG. 6B, the channel region A1 exposed by the dummy gate structures DG1-DG8 and the gate spacers 120 is recessed by suitable process, such as etching. Afterwards, the source/drain structures SD1-SD5 are formed respectively over the exposed surfaces of the remaining channel region A1. The source/drain structures SD1-SD5 may be formed by performing an epitaxial growth process that grows an epitaxy semiconductor material from the channel region A1. The source/drain structures SD1-SD5 are doped with an n-type impurity (e.g., phosphorous) or a p-type impurity (e.g., boron), depending on the conductivity-type of the respective resulting transistors.

An interlayer dielectric layer (ILD) 130 is formed adjacent to the gate spacers 120. For example, a dielectric layer is deposited blanket over the substrate 100 and filling the spaces between the gate spacers 120, followed by a CMP process to remove excessive material of the dielectric layer until the top surfaces of the dummy gate structures DG1-DG8 are exposed.

Figure 7A:
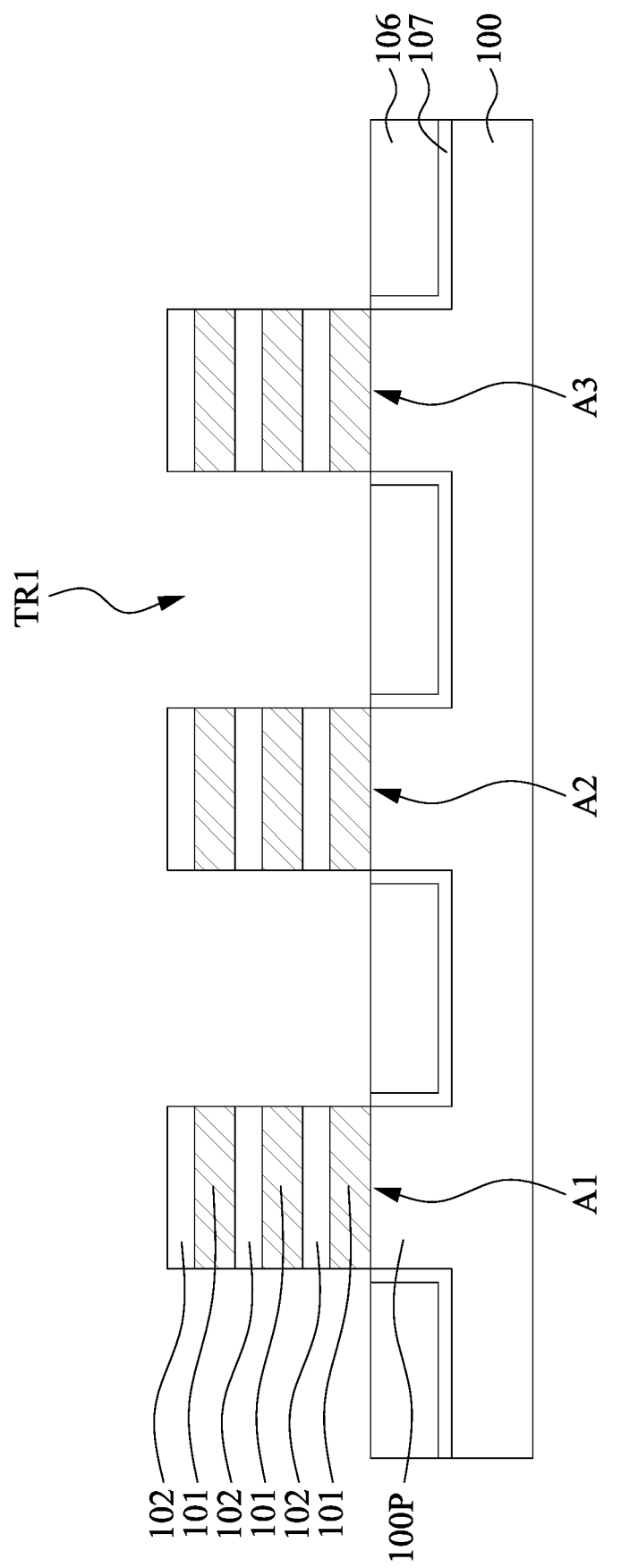
Figure 7B:
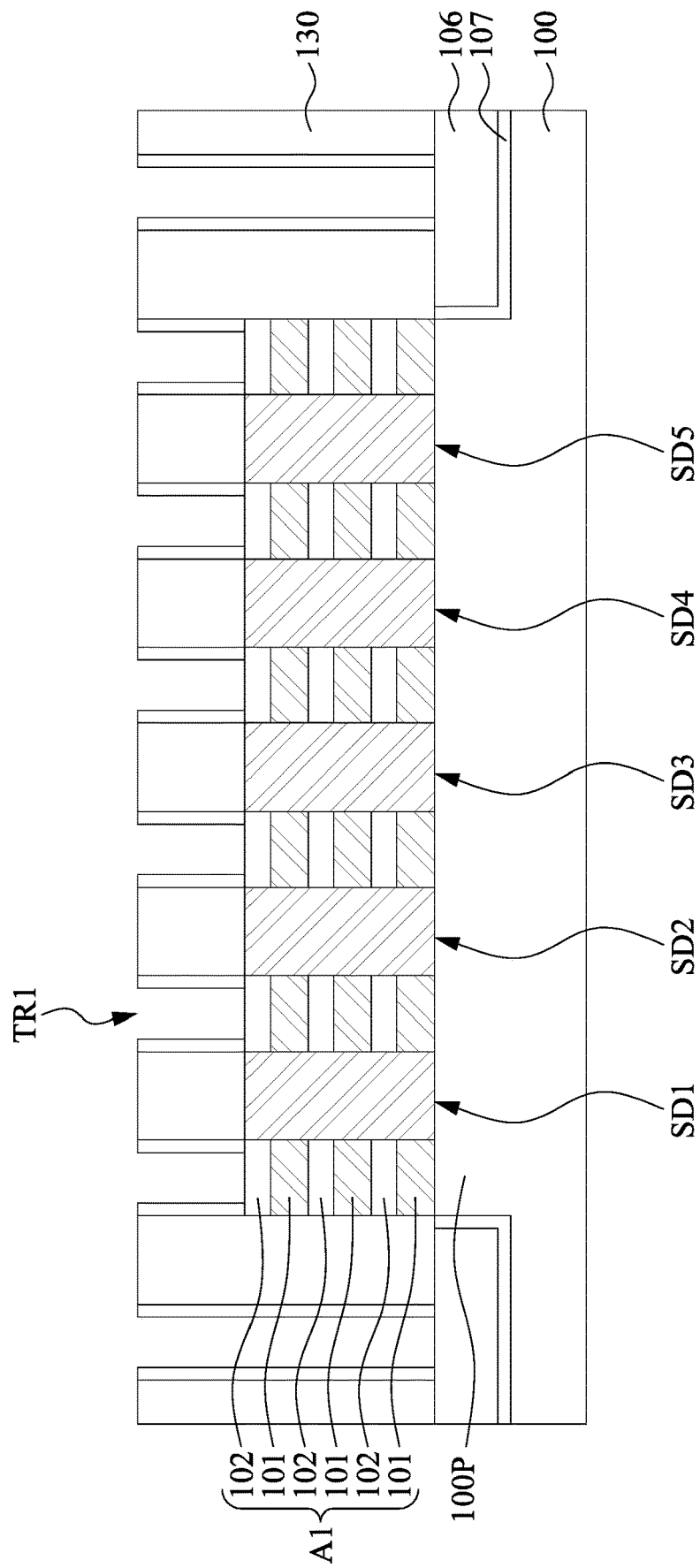

Reference is made to FIGS. 7A and 7B, in which FIGS. 7A and 7B follow FIGS. 6A and 6B, respectively. The dummy gate structures DG1-DG8 are removed to form gate trenches TR1 between gate spacers 120. In some embodiments, the dummy gate structures DG1-DG8 may be removed by suitable etching process, such as dry etching, wet etching, or combinations thereof. After the etching process, the first semiconductor layers 101 and the second semiconductor layers 102 of the channel regions A1, A2, and A3 are exposed by the gate trenches TR1 between the gate spacers 120.

Figure 8A:
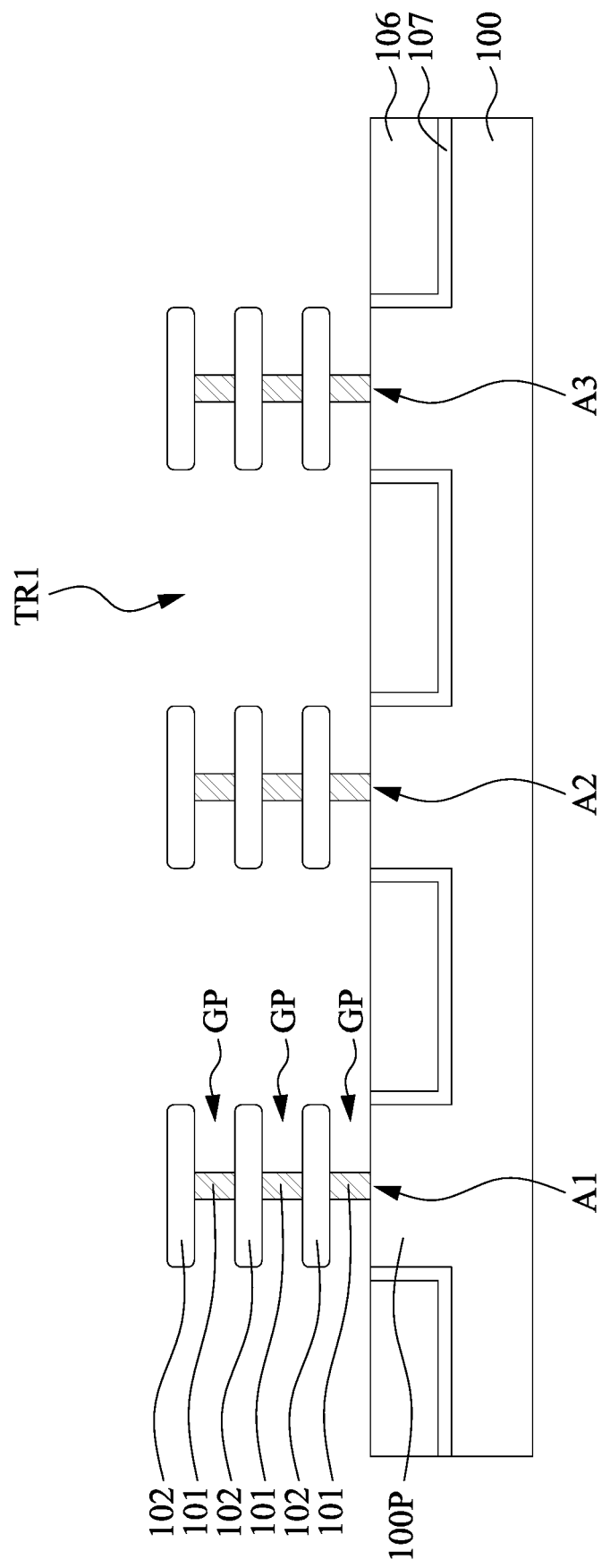
Figure 8B:
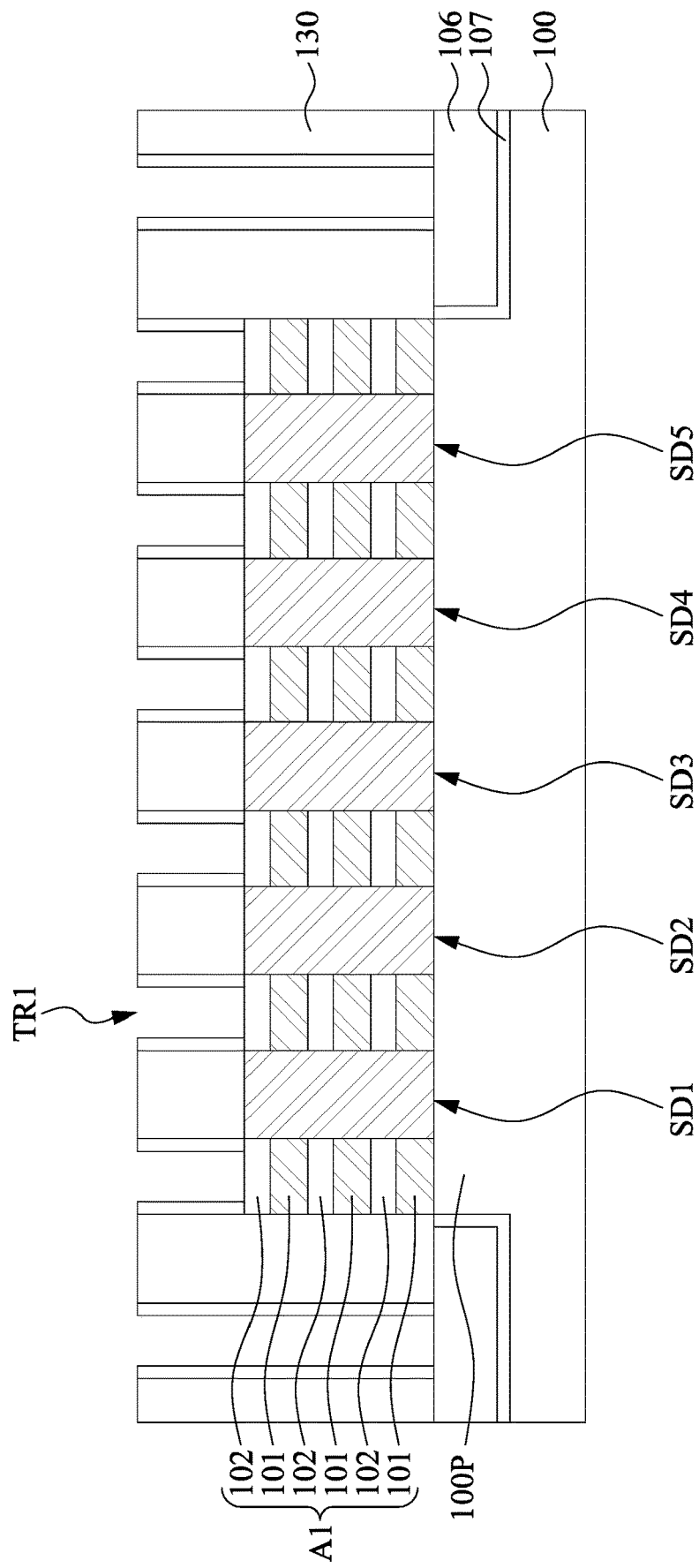

Reference is made to FIGS. 8A and 8B, in which FIGS. 8A and 8B follow FIGS. 7A and 7B, respectively. The first semiconductor layers 101 are narrowed down along a direction perpendicular to the lengthwise direction of the channel regions A1, A2, and A3, as shown in FIG. 8A. In some embodiments, the first semiconductor layers 101 may be narrowed using an etching process, such as dry etching, wet etching, or combinations thereof. In some embodiments, the first semiconductor layers 101 and the second semiconductor layers 102 include etching selectivity, and thus the first semiconductor layers 101 may be partially removed while the second semiconductor layers 102 remains substantially intact after the etching process. However, the remaining first semiconductor layers 101 are still in contact with the second semiconductor layers 102 over and below the remaining first semiconductor layers 101. That is, the etchant does not laterally etch through the semiconductor layers 101. In some embodiments, the etching process uses halogen-containing etchants. In some embodiments, the etchant includes fluorine-containing fluid, such as fluorine and/or hydrogen fluoride.

As a result, gaps GP are formed between adjacent second semiconductor layers 102, in which the bottommost gaps GP are formed between a second semiconductor layer 102 and the protrusion portions 100P of the substrate 100. In some embodiments, the second semiconductor layers 102 above and below a first semiconductor layer 101 define the top surface and the bottom surface of the gaps GP, and the first semiconductor layer 101 define the sidewalls of the gaps GP. In some embodiments, two gaps GP are formed on opposite sides of the first semiconductor layer 101, as shown in FIG. 8A.

On the other hand, along the lengthwise direction of the channel regions A1, A2, and A3 (see FIG. 8B), the width of the first semiconductor layers 101 is substantially the same after the etching process. This is because along the lengthwise direction of the channel regions A1, A2, and A3, sidewalls of the first semiconductor layers 101 are confined by the source/drain structures SD1-SD5, and thus etchant is hard to etch the first semiconductor layers 101 along this direction, which results in that the width of the first semiconductor layers 101 is substantially the same after the etching process. In some embodiments, the source/drain structures SD1-SD5 remain in contact with the first semiconductor layers 101 after the etching process. As a result, the lateral width loss of the first semiconductor layers 101 along the direction perpendicular to the lengthwise direction of the channel regions A1, A2, and A3 (FIG. 8A) is greater than the lateral width loss of the first semiconductor layers 101 along the lengthwise direction of the channel regions A1, A2, and A3 (FIG. 8B). Accordingly, after the etching process, the width difference between the first semiconductor layers 101 and the second semiconductor layers 102 along the direction perpendicular to the lengthwise direction of the channel regions A1, A2, and A3 (FIG. 8A) is greater than the width difference between the first semiconductor layers 101 and the second semiconductor layers 102 along the lengthwise direction of the channel regions A1, A2, and A3 (FIG. 8B).

Figure 9B:
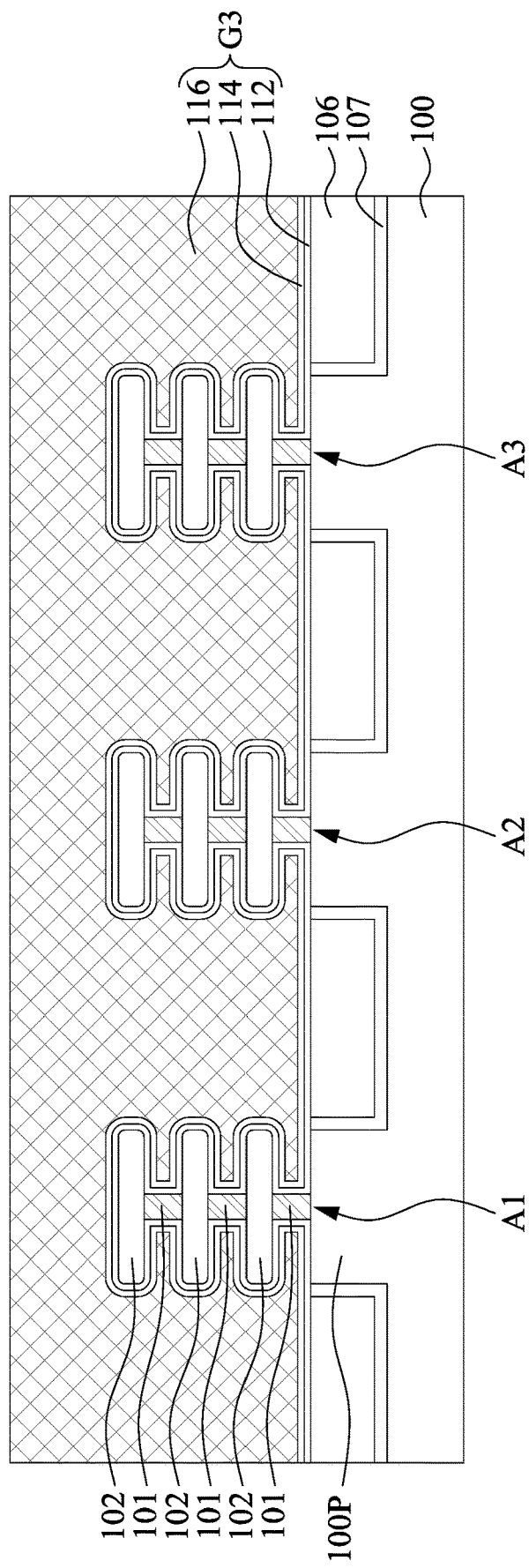
Figure 9C:
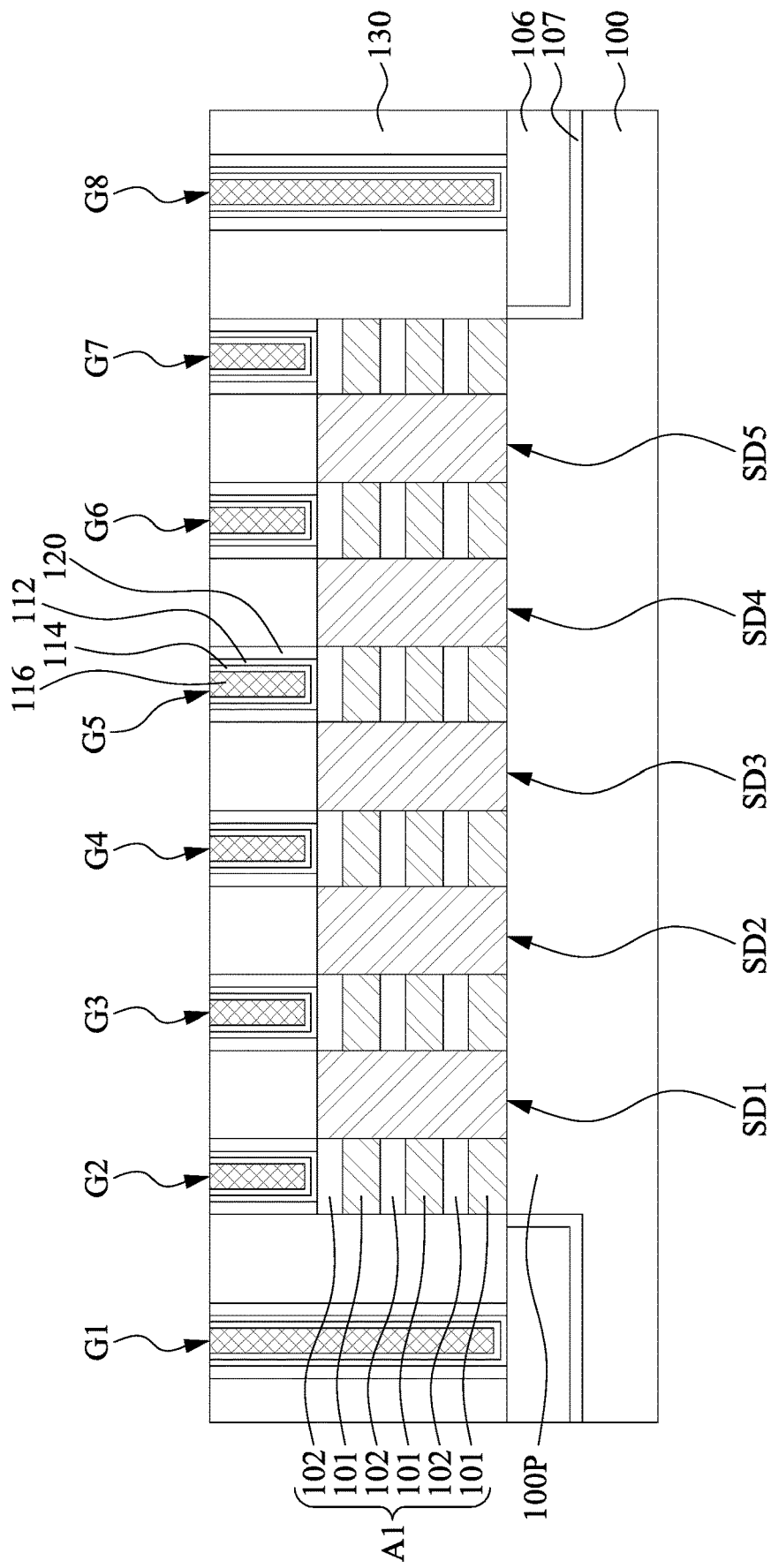

Reference is made to FIGS. 9A to 9C, in which FIG. 9A is a top view of the memory device 10, FIG. 9B is a cross-sectional view along line B-B of FIG. 9A, and FIG. 9C is a cross-sectional view along line C-C of FIG. 9A. FIGS. 9B and 9C follow FIGS. 8A and 8B, respectively. Metal gate structures G1, G2, G3, G4, G5, G6, G7, and G8 are formed in the gate trenches TR1 (see FIGS. 8A and 8B), respectively. In some embodiments, each of the gate structures G1-G8 includes a gate dielectric layer 112, a work function metal layer 114, and a filling metal 116. The gate structures G1-G8 may be formed by, for example, depositing a gate dielectric material, a work function metal material, and a conductive material in the gate trenches TR1, followed by a CMP process to remove excessive materials of the gate dielectric material, the work function metal material, and the conductive material until the ILD layer 130 is exposed.

As shown in FIG. 9B, the gate structures G1-G8 (gate structure G3 as an example in FIG. 9B) fill the gaps GP between the second semiconductor layers 102. In some embodiments, the gate dielectric layer 112, the work function metal layer 114, and the filling metal 116 of the gate structures G1-G8 are directly filled in the gaps GP, such that the gate dielectric layer 112, the work function metal layer 114, and the filling metal 116 are directly between the second semiconductor layers 102. On the other hand, the gate dielectric layer 112, the work function metal layer 114, and the filling metal 116 are directly between the bottommost second semiconductor layers 102 and the protrusion portions 100P of the substrate 100. The gate dielectric layer 112 of the gate structures G1-G8 lines the top surfaces, sidewalls, and bottom surfaces of the second semiconductor layers 102, and lines the sidewalls of the first semiconductor layer 101.

Figure 10A:
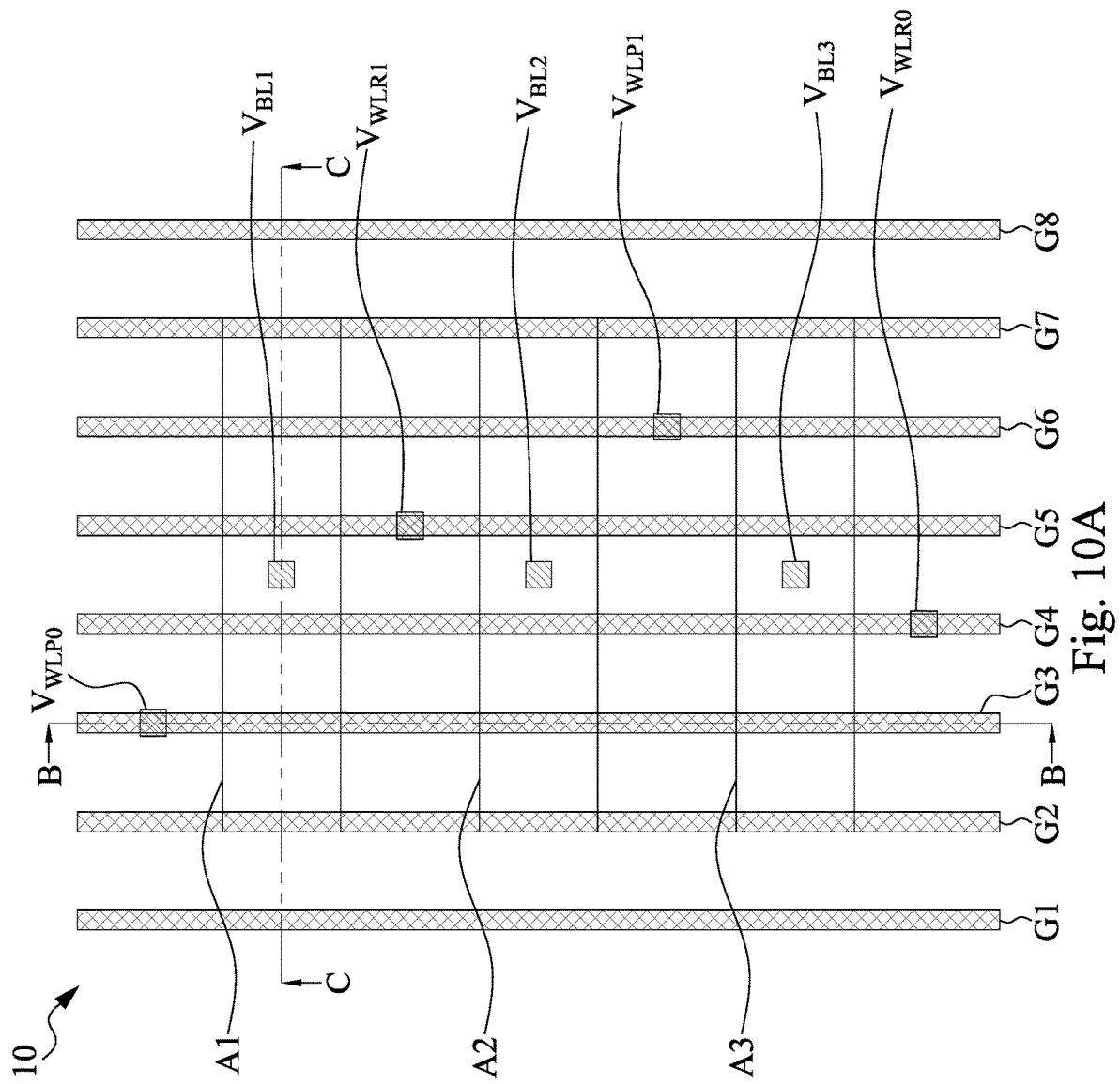
Figure 10B:
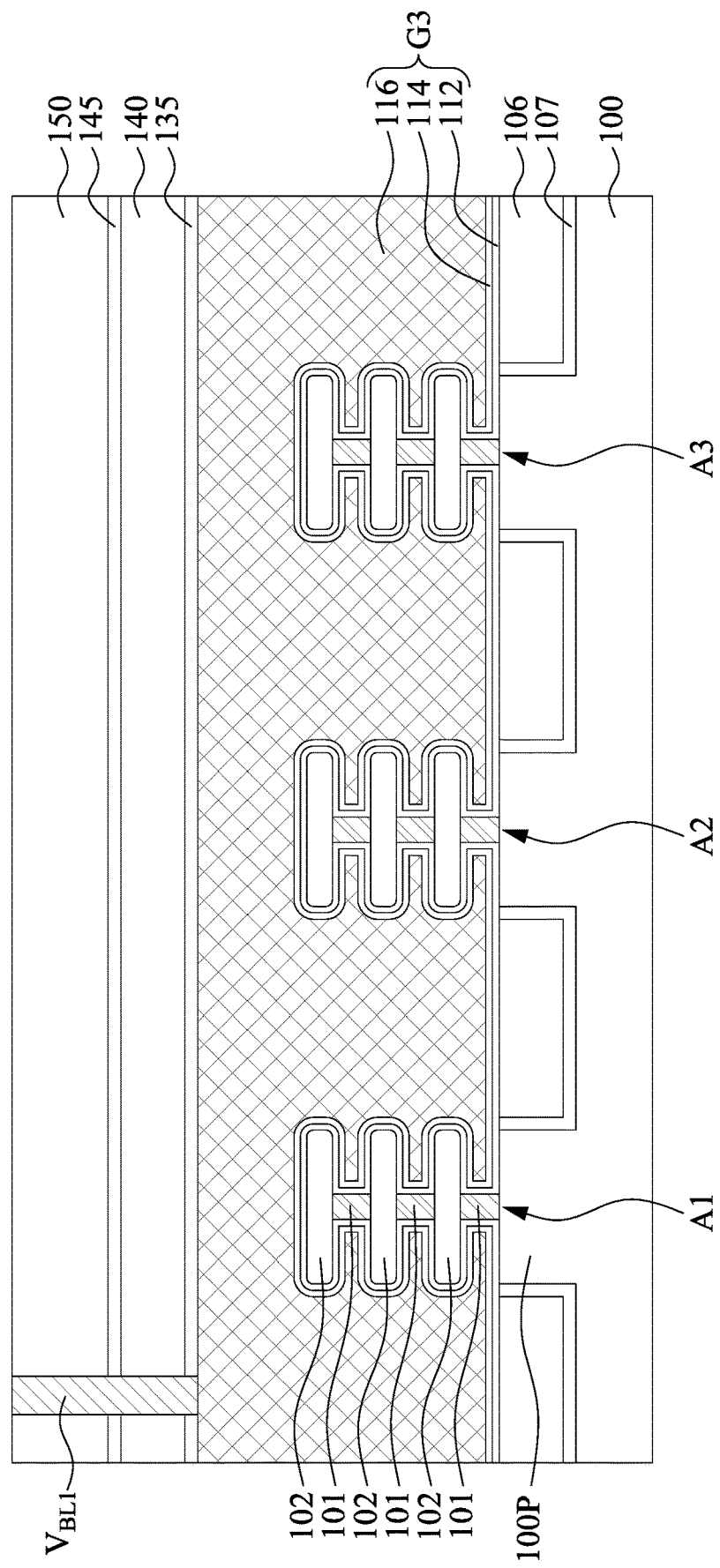
Figure 10C:
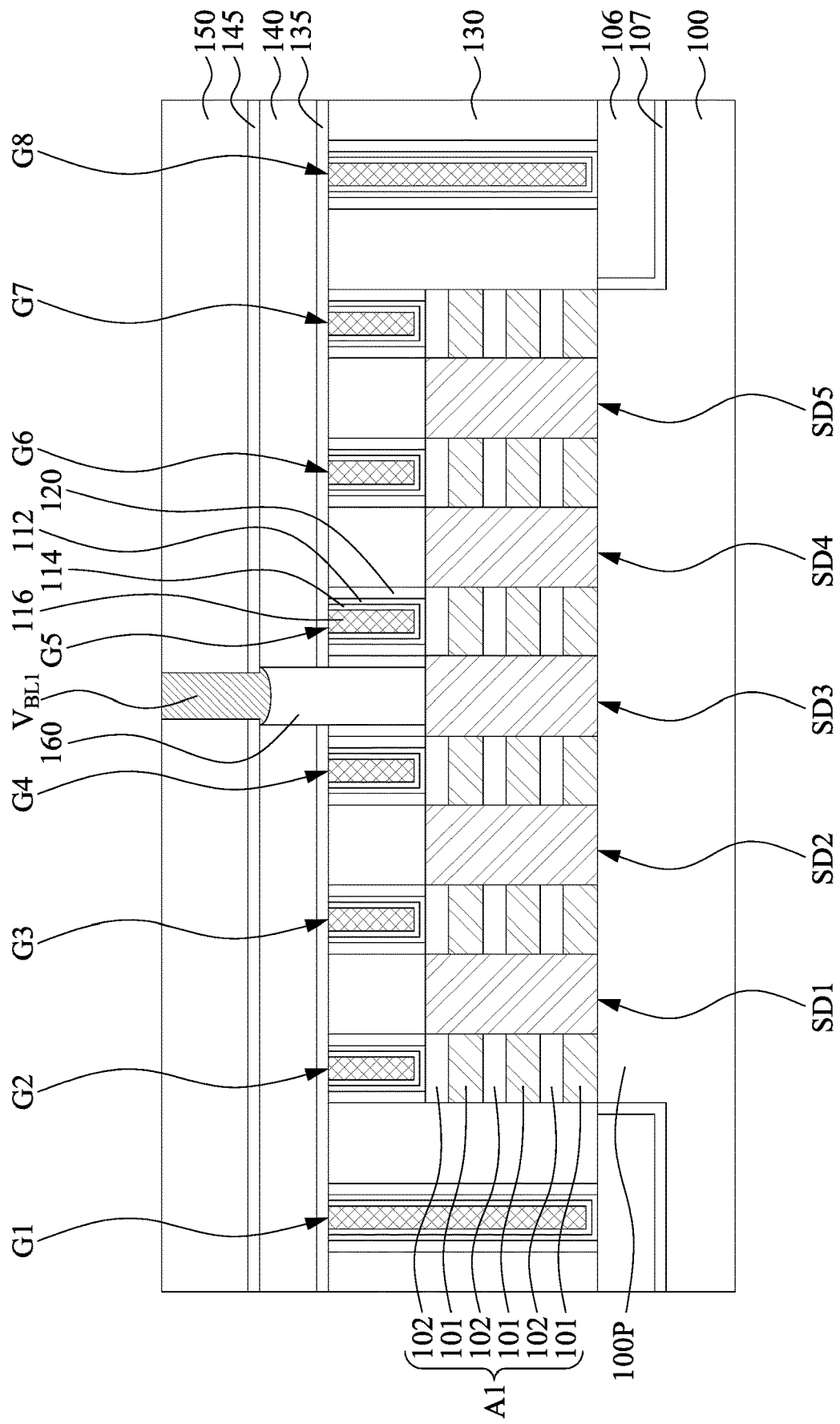

Reference is made to FIGS. 10A to 10C, in which FIG. 10A is a top view of the memory device 10, FIG. 10B is a cross-sectional view along line B-B of FIG. 10A, and FIG. 10C is a cross-sectional view along line C-C of FIG. 10A. An etch stop layer (ESL) 135 and an interlayer dielectric layer (ILD) 140 are formed over the gate structures G1-G8. The ESL 135 can be formed using, for example, plasma enhanced CVD, low pressure CVD, ALD or other suitable techniques. The ILD layer 140 may be formed using, for example, CVD, ALD, spin-on-glass (SOG) or other suitable techniques.

A plurality of source/drain contacts 160 are formed in contact with the source/drain structures. As an example of FIG. 10C, a source/drain contact 160 is formed in contact with the source/drain structure SD3. In some embodiments, the source/drain contacts 160 may be formed by, for example, etching the ILD layer 140, the ESL 135, and the ILD layer 130 to form openings that expose the source/drain structures, filling conductive material in the openings, followed by a CMP process to remove excessive material of the conductive material until a top surface of the ILD layer 140 is exposed.

An etch stop layer (ESL) 145 and an interlayer dielectric layer (ILD) 150 are formed over the ILD layer 140. The ESL 135 can be formed using, for example, plasma enhanced CVD, low pressure CVD, ALD or other suitable techniques. The ILD layer 150 may be formed using, for example, CVD, ALD, spin-on-glass (SOG) or other suitable techniques.

A plurality of vias $V_{BL1}$, $V_{BL2}$, $V_{BL3}$, $V_{WLR0}$, $V_{WLP0}$, $V_{WLR1}$, and $V_{WLP1}$ are formed. For example, the vias $V_{BL1}$, $V_{BL2}$, $V_{BL3}$, $V_{WLR0}$, $V_{WLP0}$, $V_{WLR1}$, and $V_{WLP1}$ may be formed by, etching the ESL 135, ILD layer 140, ESL 145, and ILD 150 to from openings, forming a conductive layer in the openings, followed by a CMP process to remove excessive conductive layer until top surface of the ILD 150 is exposed. In some embodiments, the vias $V_{WLR0}$, $V_{WLP0}$, $V_{WLR1}$, and $V_{WLP1}$ are landed on the gate structures G4, G3, G5, and G6, respectively. As an example in FIG. 10B, the via $V_{WLP0}$ contacts the gate structure G3. In some embodiments, vias $V_{BL1}$, $V_{BL2}$, $V_{BL3}$ are landed on the source/drain contacts 160 over the channel regions A1, A2, and A3, respectively. As an example in FIG. 10C, the via $V_{BL1}$ contacts the source/drain contact 160 over the channel region A1.

Figure 11A:
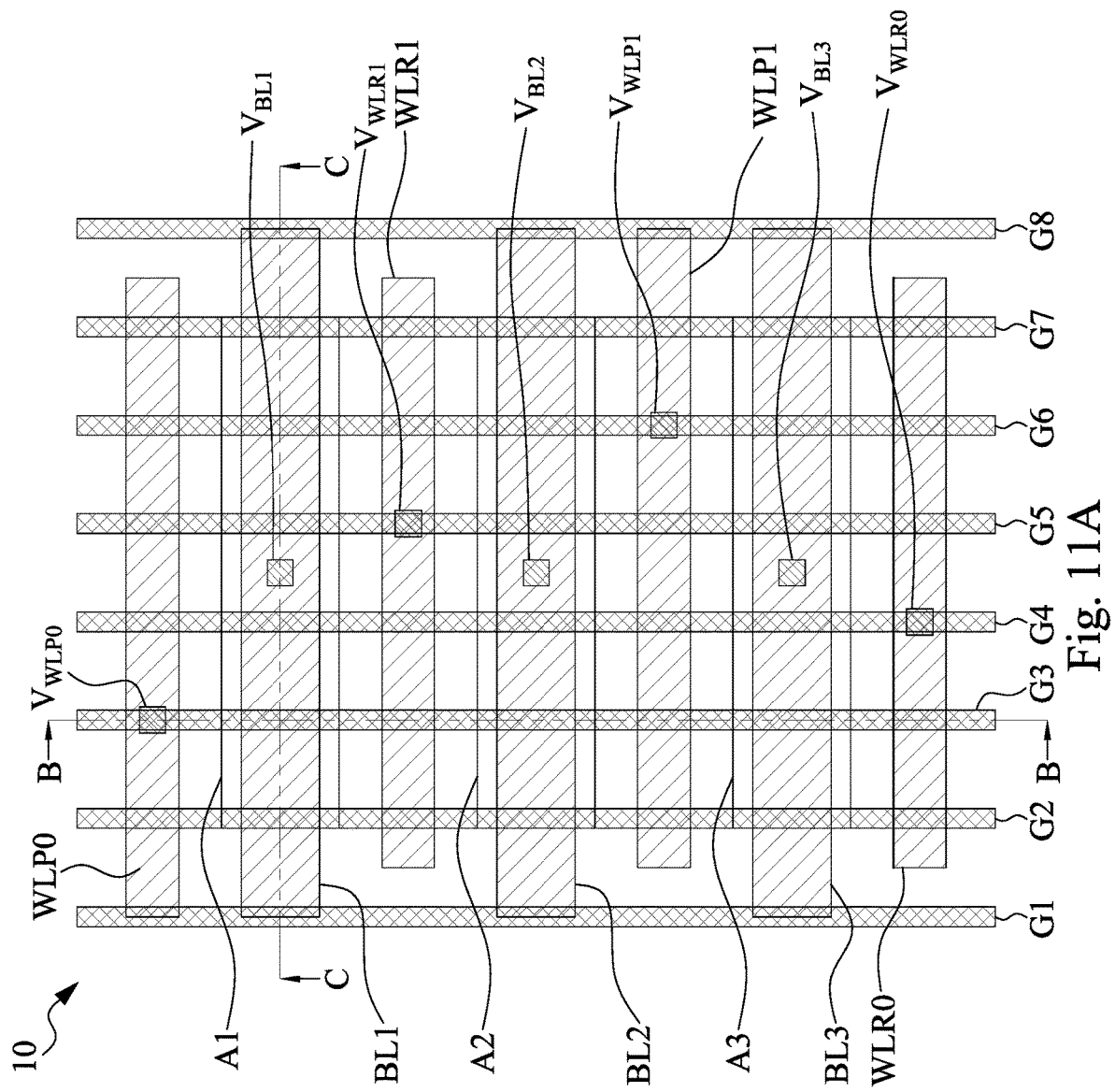
Figure 11B:
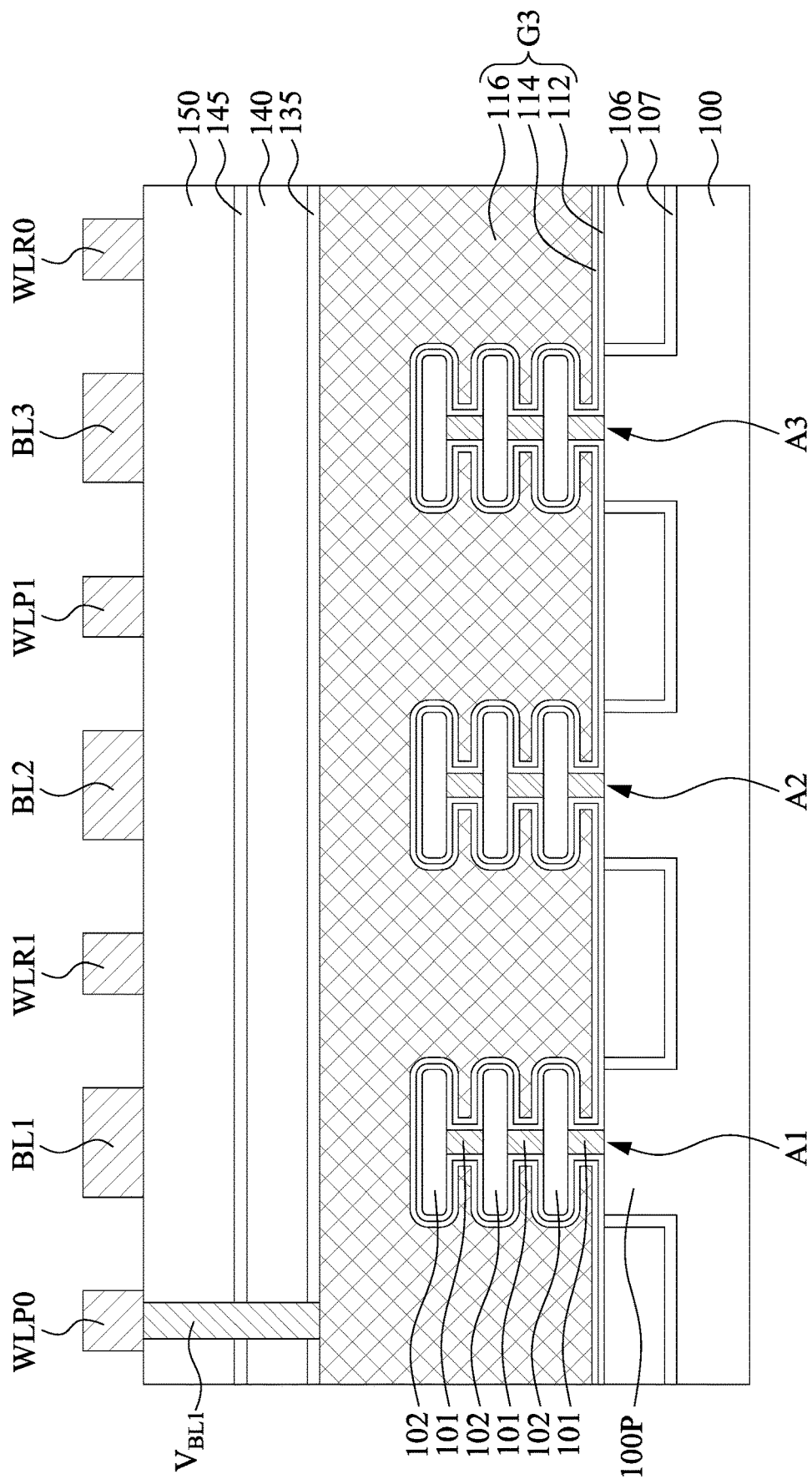
Figure 11C:
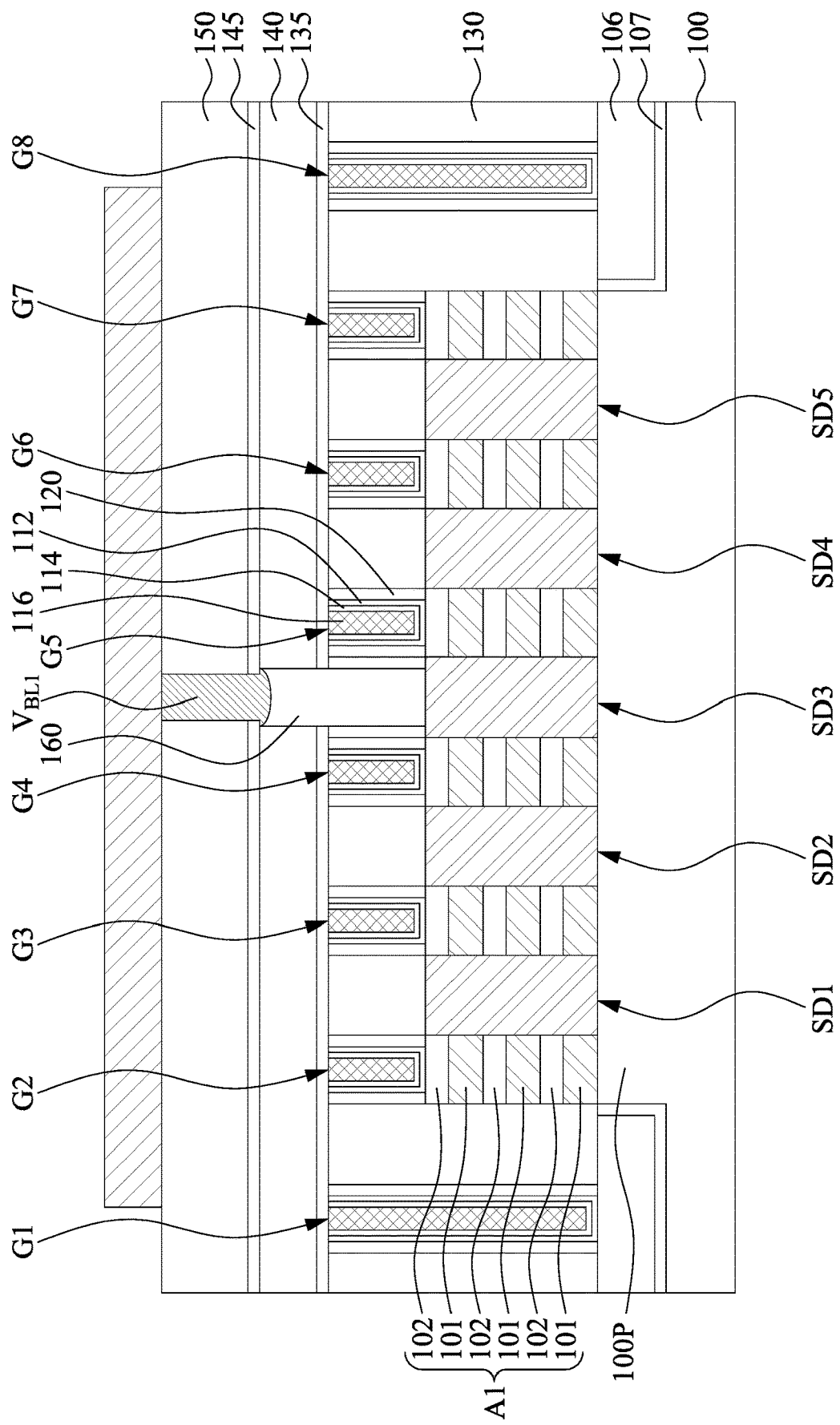

Reference is made to FIGS. 11A to 11C, in which FIG. 11A is a top view of the memory device 10, FIG. 11B is a cross-sectional view along line B-B of FIG. 11A, and FIG. 11C is a cross-sectional view along line C-C of FIG. 11A. Bit lines BL1, BL2, and BL3 and word lines WLP0, WLR0, WLP1, and WLR1 are formed over the ILD layer 150. For example, a conductive layer is deposited over the ILD layer 150, and the conductive layer is patterned according to a predetermined pattern. As a result, the portions of the remaining conductive layer over the vias $V_{BL1}$, $V_{BL2}$, $V_{BL3}$, $V_{WLP0}$, $V_{WLR0}$, $V_{WLP1}$, and $V_{WLR1}$ are referred to as the bit lines BL1, BL2, and BL3 and word lines WLP0, WLR0, WLP1, and WLR1, respectively.

Figure 12B:
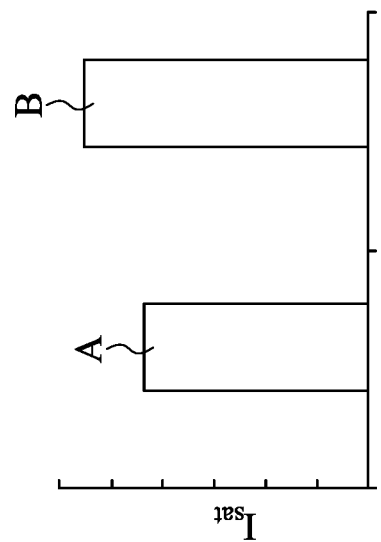
FIGS. 12A and 12B illustrate simulation results of memory devices in accordance with some embodiments of the present disclosure.
Figure 12A:
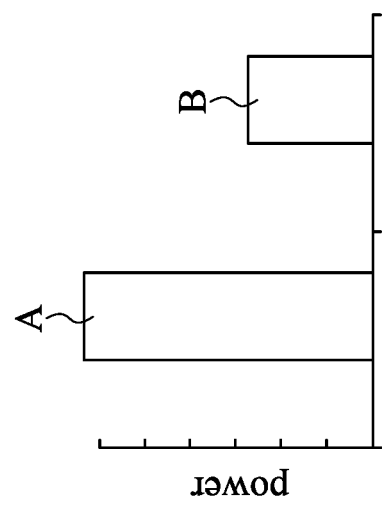

FIG. 12A illustrates simulation results of reduction of power by introducing nanosheet structure into a memory device in accordance with some embodiments. FIG. 12B illustrates simulation results of improvement of saturation current $I_{sat}$ by introducing nanosheet structure into a memory device in accordance with some embodiments.

In FIGS. 12A and 12B, Conditions A and B illustrate simulation results of the a memory device discussed above, in which Condition A is a simulation result of a memory device without the nanosheet structure discussed above, and Condition B is a simulation result of a memory device with the nanosheet structure discussed above. As shown in FIG. 12A, comparing Condition A with Condition B, it is clear that forming the nanosheet structure in a memory device can reduce power of the memory device. In some embodiments where the nanosheet structure is introduced in the memory device, the power of the memory device can be reduce about 40%, and the breakdown voltage of the transistors of the memory device (such as the transistors T0 discussed in FIG. 1) can be reduced about 0.2V. On the other hand, as shown in FIG. 12B, it is clear that forming the nanosheet structure in a memory device can improve saturation current $I_{sat}$ of the transistors of the memory device. In some embodiments where the nanosheet structure is introduced in the memory device, the saturation current $I_{sat}$ of the transistors of the memory device can be increased about 30%.

Figure 13:
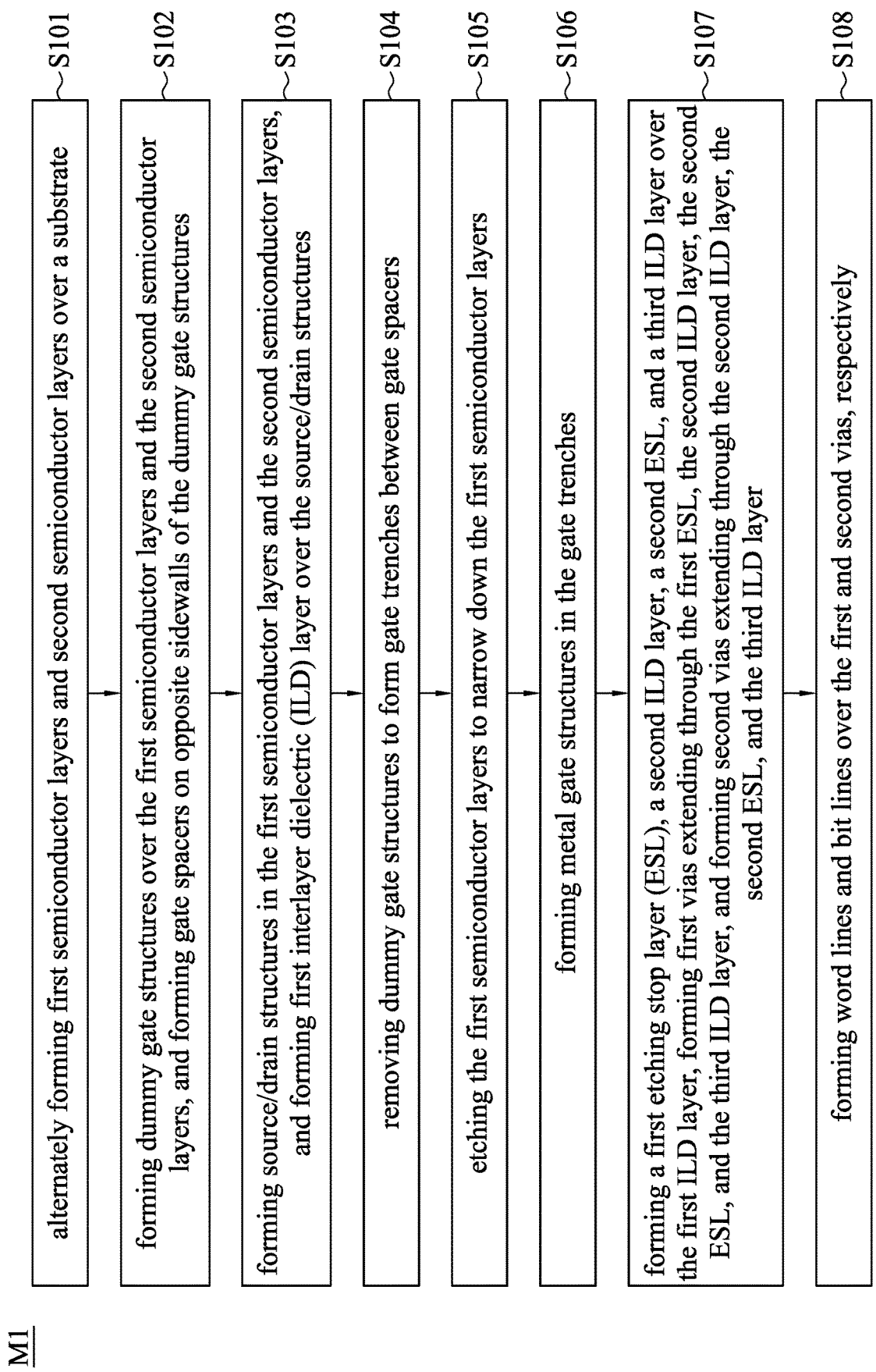
FIG. 13 is a method of manufacturing a memory device in accordance with some embodiments of the present disclosure.

FIG. 13 illustrates a method M1 of manufacturing a memory device in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, alternately forming first semiconductor layers and second semiconductor layers over a substrate. FIGS. 4A to 4C illustrate schematic views of some embodiments corresponding to act in block S101.

At block S102, forming dummy gate structures over the first semiconductor layers and the second semiconductor layers, and forming gate spacers on opposite sidewalls of the dummy gate structures. FIGS. 5A to 5C illustrate schematic views of some embodiments corresponding to act in block S102.

At block S103, forming source/drain structures in the first semiconductor layers and the second semiconductor layers, and forming first interlayer dielectric (ILD) layer over the source/drain structures. FIGS. 6A and 6B illustrate schematic views of some embodiments corresponding to act in block S103.

At block S104, removing dummy gate structures to form gate trenches between gate spacers. FIGS. 7A and 7B illustrate schematic views of some embodiments corresponding to act in block S104.

At block S105, etching the first semiconductor layers to narrow down the first semiconductor layers. FIGS. 8A and 8B illustrate schematic views of some embodiments corresponding to act in block S105.

At block S106, forming metal gate structures in the gate trenches. FIGS. 9A to 9C illustrate schematic views of some embodiments corresponding to act in block S106.

At block S107, forming a first etching stop layer (ESL), a second ILD layer, a second ESL, and a third ILD layer over the first ILD layer, forming first vias extending through the first ESL, the second ILD layer, the second ESL, and the third ILD layer, and forming second vias extending through the second ILD layer, the second ESL, and the third ILD layer. FIGS. 10A to 10C illustrate schematic views of some embodiments corresponding to act in block S107.

At block S108, forming word lines and bit lines over the first and second vias, respectively. FIGS. 11A to 11C illustrate schematic views of some embodiments corresponding to act in block S108.

Figure 14:
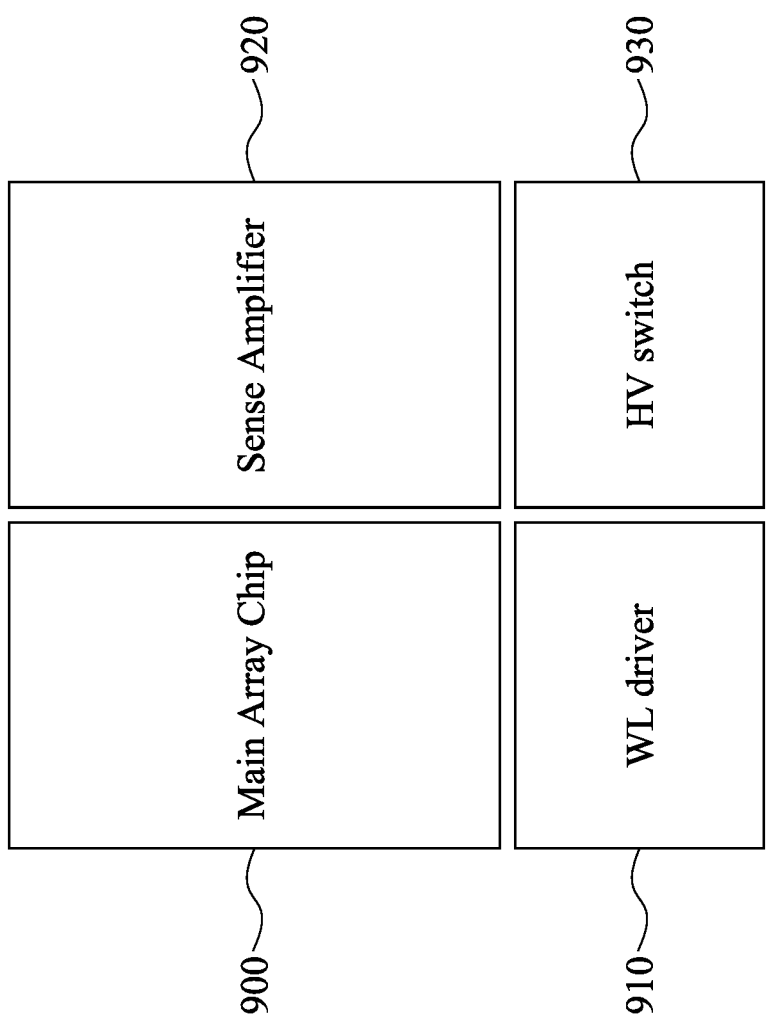
FIG. 14 is a block diagram in accordance with some embodiments of the present disclosure.

FIG. 14 is a block diagram of a semiconductor device in accordance with some embodiments of the present disclosure. The semiconductor device includes a main array chip 900, a word line (WL) driver 910, a sense amplifier 920 and a high voltage (HV) switch 930 electrically coupled to each other.

The main array chip 900 may include a plurality of memory cells and a plurality of word lines and bit lines coupled to the memory cells. For example, the main array chip 900 may be the memory device as discussed in FIG. 1, which includes memory cells C1 to C6, word lines WLP0, WLR0, WLP1, WLR1, and bit lines BL1, BL2, BL3. Each of the memory cells C1 to C6 includes transistors T0 and T1. In some embodiments, the word line (WL) driver 910, the sense amplifier 920 and the HV switch 930 may include a plurality of transistors to perform desired functions.

In some embodiments, input/output (I/O) circuitry of the main array chip 900 allows program/read operation to the memory cells of the main array chip 900, and is generally coupled to the WL driver 910 and the sense amplifier 910. In some embodiments, word lines of the main array chip 900 are coupled to the WL driver 910, and bit lines of the main array chip 900 are coupled to the sense amplifier 910.

During program/read operation to the memory cells of the main array chip 900, the WL driver 910 may supply voltages to the word lines to adjust (e.g., to raise or lower) the voltage levels of the selected word lines. For example, WL driver 910 may supply voltages to the word lines word lines WLP0, WLR0, WLP1, WLR1 as discussed in FIGS. 2A and 2B above. The HV switch 930 may be an appropriate switching circuitry configured to provide a relatively high voltage signal to the WL driver 910. During read operation, the sense amplifier 910 detects signal difference between at least two bit lines to distinguish logic high and low states. For example, the sense amplifier 910 may detect signal difference between bit lines BL1, BL2, BL3 as discussed in FIGS. 2A and 2B above.

Figure 15:
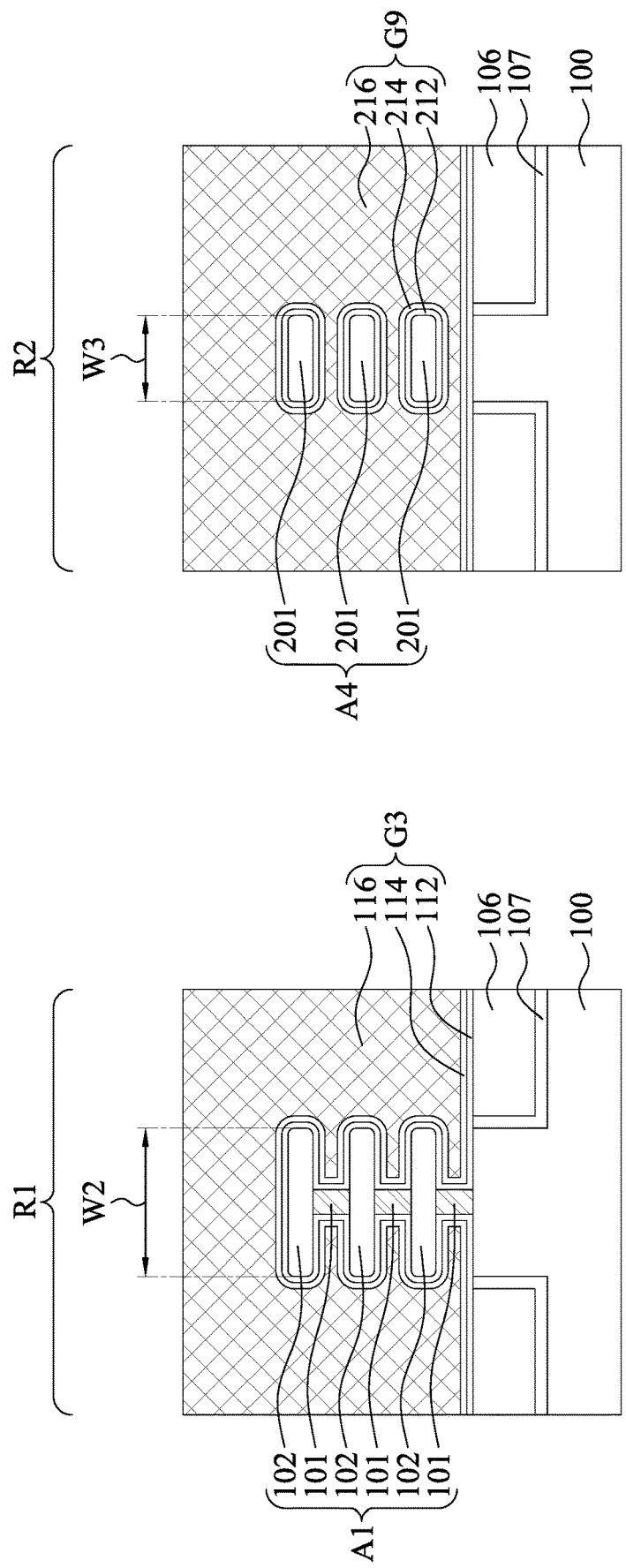
FIG. 15 is a memory device in accordance with some embodiments of the present disclosure.

Reference is made to FIG. 15. FIG. 15 illustrates two transistors T3 and T4, in which the transistor T3 is disposed in a first region R1 of the substrate 100, and the transistor T4 is disposed in a second region R2 of the substrate 100. In some embodiments, the first region R1 of the substrate 100 may be the main array chip 900 of FIG. 14. On the other hand, the second region R2 may be the WL driver 910, the sense amplifier 920, and the HV switch 930 of FIG. 14. Stated another way, the transistor T3 is disposed within the main array chip 900 of FIG. 14, while the transistor T4 is disposed within the WL driver 910, the sense amplifier 920, and the HV switch 930 of FIG. 14.

The transistor T3 is similar to the transistor discussed in FIGS. 3A to 11C. For example, the transistor T3 includes the channel region A1 and the gate structure G3 crossing the channel region A1. The channel region A1 includes first semiconductor layers 101 and second semiconductor layers 102 alternately stacked, in which the first semiconductor layers 101 are narrower than the second semiconductor layers 102. It is noted that the channel region A1 and the gate structure G3 of FIG. 15 can be replaced with the channel regions A2, A3 and the gate structures G2, G4, G5, G6, respectively.

On the other hand, the transistor T4 includes a channel region A4 and a gate structure G9 crossing the channel region A9. The channel region A4 include a plurality of second semiconductor layers 202 suspended over the substrate 100, in which the second semiconductor layers 202 are similar or the same as the second semiconductor layers 102 of the transistor T3. The gate structure G9 includes a gate dielectric layer 212, a work function metal layer 214, and a filling metal 216, which are similar or the same as the gate dielectric layer 212, the work function metal layer 214, and the filling metal 216 of gate structure G3 of the transistor T3. The transistor T4 of second region R2 is different from the transistor T3 of first region R1, in that the channel region A4 of the transistor T4 is free from material of the first semiconductor layers 101 of the transistor T3. As a result, gate structure G9 along the lengthwise direction of the gate structure G9, the gate structure G9 entirely surrounds the second semiconductor layers 202.

In some embodiments, the second semiconductor layers 102 of transistor T3 have a width W2, and the second semiconductor layers 202 of transistor T4 have a width W3, in which width W3 is less than width W2. In some embodiments, the transistors T3 and the transistor T4 can be formed by the method discussed in FIGS. 4A to 11C. For example, first and second semiconductor layers are alternately formed over a substrate, etching the first semiconductor layers, and followed by forming a gate structure. In some embodiments, because the width W3 of the second semiconductor layers 202 is less than width W2 of the second semiconductor layers 102, the first semiconductor layers (not shown) will be completely removed during the operation for etching the first semiconductor layers as discussed in FIGS. 8A and 8B. However, because the width W2 of the second semiconductor layers 102 is larger, and thus the first semiconductor layers 101 remain between the second semiconductor layers 102 after the etching, as discussed in FIGS. 8A and 8B.

Figure 16B:
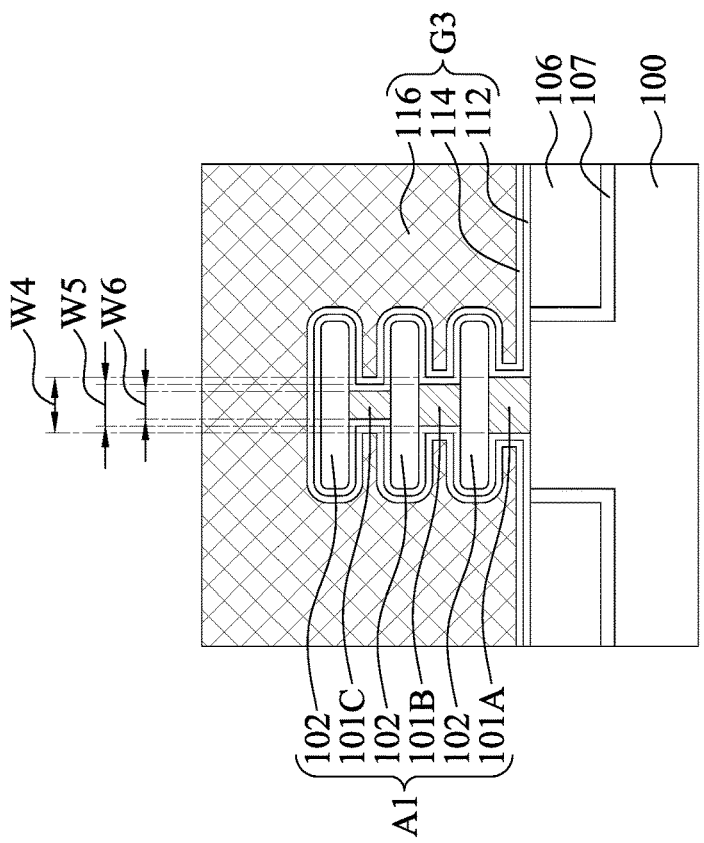
FIGS. 16A and 16B a memory device in accordance with some embodiments of the present disclosure.
Figure 16A:
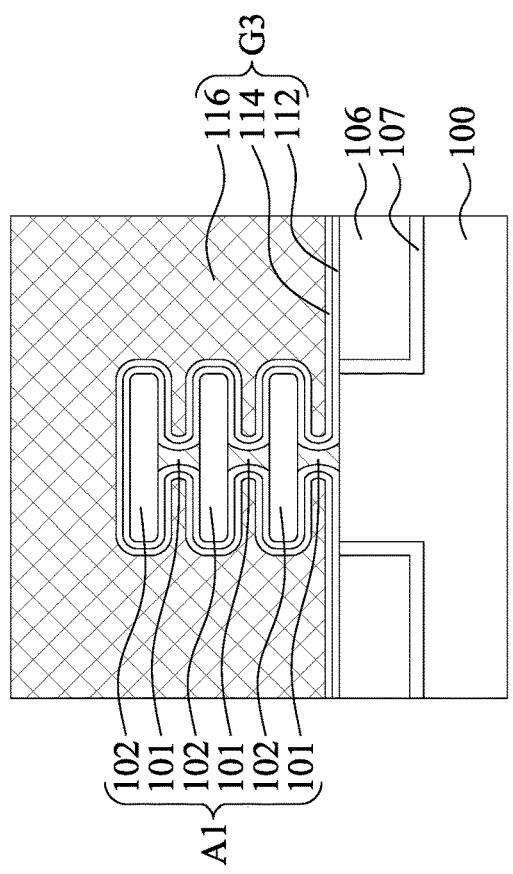

Reference is made to FIGS. 16A and 16B. FIGS. 16A and 16B are memory devices in accordance with some embodiments of the present disclosure. The memory devices of FIGS. 16A and 16B are similar to the memory device 10 discussed in FIGS. 3A to 3D, and thus relevant structural details are omitted for simplicity.

In FIG. 16A, the first semiconductor layers 101 have concave sidewall. This is resulted from the etching process for narrowing down the first semiconductor layers 101, as discussed in FIGS. 8A and 8B. Accordingly, the gate structure G3 and the first semiconductor layers 101 have curved interfaces.

In FIG. 16B, shown there is a first semiconductor layer 101A, a first semiconductor layer 101B over the first semiconductor layer 101A, and a first semiconductor layer 101C over the first semiconductor layer 101B, in which first semiconductor layers 101A, 101B, 101C are made of the same material, and are the same as the first semiconductor layers 101 discussed above. The first semiconductor layers 101A, 101b, and 101C have widths W4, W5, and W6, in which W4 is greater than width W5, and width W5 is greater than width W6. This is resulted from the etching process for narrowing down the first semiconductor layers as discussed in FIGS. 8A and 8B, because the etchant of the etching process is hard to go deeper and reach the lower first semiconductor layers.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that because the channel region includes a nanosheet structure, contact area between the gate structure and the channel region is increased, which in turn will improve the electron mobility, and thus will increase the saturation current $I_{sat}$ of the transistors of the memory device. Another advantage is that, because the gate dielectric layer of the gate structure may induce high electric fields at corners of the nanosheet structure. The electric fields may contribute to the voltage for destroying the dielectric layers of the transistors of memory device. Accordingly, the breakdown voltage of the transistors of memory device can be reduced, and thus the power of the memory device may also be reduced.

Accordingly to some embodiments of the present disclosure, a memory device includes a substrate, first semiconductor layers and second semiconductor layers alternately stacked over the substrate, a first gate structure and a second gate structure crossing the first semiconductor layers and the second semiconductor layers, a first via and a second via over the first gate structure and the second gate structure, and a first word line and a second word line over the first via and the second via. Along a lengthwise direction of the first and second gate structures, a width of the first semiconductor layers is narrower than a width of the second semiconductor layers.

Accordingly to some embodiments of the present disclosure, a memory device includes a substrate, first semiconductor layers and second semiconductor layers alternately stacked over the substrate, source/drain structures on opposite sides of the first semiconductor layers and the second semiconductor layers, a gate structure crossing the first semiconductor layers and the second semiconductor layers, a bit line over the source/drain structures, and a word line over the gate structure. A width difference between the first semiconductor layers and the second semiconductor layers along a lengthwise direction of the gate structure is greater than a width difference between the first semiconductor layers and the second semiconductor layers along a direction perpendicular to the lengthwise direction of the gate structure.

Accordingly to some embodiments of the present disclosure, a method includes alternately forming first semiconductor layers and second semiconductor layers over a substrate; forming a dummy gate structure over the first semiconductor layers and the second semiconductor layers; forming gate spacers on opposite sidewalls of the dummy gate structure; removing the dummy gate structure to expose the first semiconductor layers and the second semiconductor layers; etching the first semiconductor layers to narrow down the first semiconductor layers, such that gaps are formed vertically between two adjacent second semiconductor layers, in which the first semiconductor layers remain in contact with the second semiconductor layers after the first semiconductor layers; and forming a gate structure filling the gaps between the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
first semiconductor layers and second semiconductor layers alternately stacked over the substrate, wherein a bottommost one of the first semiconductor layers is wider than a topmost one of the first semiconductor layers;
a first gate structure and a second gate structure crossing the first semiconductor layers and the second semiconductor layers, wherein along a lengthwise direction of the first and second gate structures, a width of the first semiconductor layers is narrower than a width of the second semiconductor layers;
a first via and a second via over the first gate structure and the second gate structure, respectively; and
a first word line and a second word line over the first via and the second via, respectively.

2. The memory device of claim 1, wherein the first gate structure is in contact with bottom surfaces of the second semiconductor layers and sidewalls of the first semiconductor layers.

3. The memory device of claim 2, wherein the first gate structure comprises a gate dielectric layer, a word function metal layer, and a filling metal, wherein the gate dielectric layer, the word function metal layer, and the filling metal are directly between two adjacent second semiconductor layers.

4. The memory device of claim 1, wherein the substrate comprises a protrusion portion, the bottommost one of the first semiconductor layers is in contact with the protrusion portion of the substrate and a bottommost one of the second semiconductor layers.

5. The memory device of claim 4, wherein the first gate structure comprises a gate dielectric layer, and the gate dielectric layer extends along bottom surface of the bottommost one of the second semiconductor layers, a sidewall of the bottommost one of the first semiconductor layers, and a top surface of the protrusion portion of the substrate.

6. The memory device of claim 1, wherein the first semiconductor layers have concave sidewalls.

7. The memory device of claim 1, wherein a germanium atomic concentration of the first semiconductor layers is higher than a germanium atomic concentration of the second semiconductor layers.

8. The memory device of claim 1, wherein the first semiconductor layers are made of SiGe, and the semiconductor layers are made of Si.

9. A memory device, comprising:
a substrate;
first semiconductor layers and second semiconductor layers alternately stacked over the substrate;

source/drain structures on opposite sides of the first semiconductor layers and the second semiconductor layers, wherein the source/drain structures are in contact with the first semiconductor layers and the second semiconductor layers;

a gate structure crossing the first semiconductor layers and the second semiconductor layers, wherein a width difference between the first semiconductor layers and the second semiconductor layers along a lengthwise direction of the gate structure is greater than a width difference between the first semiconductor layers and the second semiconductor layers along a direction perpendicular to the lengthwise direction of the gate structure;

a bit line over the source/drain structures; and a word line over the gate structure.

10. The memory device of claim 9, wherein bottom surfaces of the second semiconductor layers are in contact with the first semiconductor layers and the gate structure.

11. The memory device of claim 9, wherein the first semiconductor layers have a first width and the second semiconductor layers have a second width, and the first width is less than the second width.

12. The memory device of claim 11, wherein a ratio of the first width to the second width is in a range from about 1:45 to about 1:9.

13. The memory device of claim 9, wherein the gate structure form curved interfaces with the first semiconductor layers.

14. The memory device of claim 9, further comprising gate spacers on opposite sidewalls of the gate structure, wherein along a direction vertical to a top surface of the substrate, the gate spacers overlap the first semiconductor layers and the second semiconductor layers.

15. The memory device of claim 9, wherein a germanium atomic concentration of the first semiconductor layers is higher than a germanium atomic concentration of the second semiconductor layers.

16. The memory device of claim 9, wherein the first semiconductor layers are made of SiGe, and the semiconductor layers are made of Si.

17. A method, comprising:
alternately forming first semiconductor layers and second semiconductor layers over a substrate;
forming a dummy gate structure over the first semiconductor layers and the second semiconductor layers;
forming gate spacers on opposite sidewalls of the dummy gate structure;
forming source/drain structures in contact with the first semiconductor layers and the second semiconductor layers;
removing the dummy gate structure to expose the first semiconductor layers and the second semiconductor layers;
etching the first semiconductor layers to narrow down the first semiconductor layers, such that gaps are formed vertically between two adjacent second semiconductor layers, wherein the first semiconductor layers remain in contact with the second semiconductor layers after etching the first semiconductor layers, and the source/drain structures remain in contact with the first semiconductor layers and the second semiconductor layers after etching the first semiconductor layers; and
forming a gate structure filling the gaps between the second semiconductor layers.

18. The method of claim 17, wherein etching the first semiconductor layers is performed such that widths of the first semiconductor layers decrease as a distance from the substrate increases.

19. The method of claim 18, wherein etching the first semiconductor layers is performed such that sidewalls of the first semiconductor layers are curved.

20. The method of claim 19, further comprising:
forming first via and second via over the gate structure and the source/drain structures, respectively; and
forming a word line and a bit line over the first via and the second via, respectively.

* * * * *